(12) United States Patent
Karabatsos

(10) Patent No.: US 7,606,992 B1
(45) Date of Patent: Oct. 20, 2009

(54) HIGH PERFORMANCE DATA RATE SYSTEM FOR FLASH DEVICES

(76) Inventor: Chris Karabatsos, 12 Van Keuren Hwy., Kingston, NY (US) 12401

( * ) Notice: Subject to any disclaimer, the term of this patent is extended or adjusted under 35 U.S.C. 154(b) by 0 days.

(21) Appl. No.: 11/564,390

(22) Filed: Nov. 29, 2006

Related U.S. Application Data

(60) Provisional application No. 60/740,846, filed on Dec. 1, 2005.

(51) Int. Cl.
G06F 13/00 (2006.01)
G06F 13/28 (2006.01)
G11C 5/02 (2006.01)

(52) U.S. Cl. ............... 711/170; 710/104; 365/51

(58) Field of Classification Search ........... 711/170; 710/104
See application file for complete search history.

(56) References Cited

U.S. PATENT DOCUMENTS

| | | | | |
|---|---|---|---|---|
| 6,141,249 | A * | 10/2000 | Estakhri et al. | 365/185.11 |
| 6,401,161 | B1 * | 6/2002 | Nolan et al. | 711/5 |
| 7,114,117 | B2 * | 9/2006 | Tamura et al. | 714/763 |
| 7,345,926 | B2 * | 3/2008 | Kagan et al. | 365/185.33 |
| 7,366,028 | B2 * | 4/2008 | Kagan et al. | 365/185.33 |
| 7,499,339 | B2 * | 3/2009 | Lin | 365/185.33 |
| 7,499,369 | B2 * | 3/2009 | Lin | 365/233.1 |
| 7,525,855 | B2 * | 4/2009 | Kagan | 365/189.17 |
| 2003/0182528 | A1 * | 9/2003 | Ajiro | 711/167 |
| 2004/0199714 | A1 * | 10/2004 | Estakhri et al. | 711/103 |
| 2005/0278491 | A1 * | 12/2005 | Aakjer | 711/157 |
| 2006/0023499 | A1 * | 2/2006 | Ryu | 365/185.01 |

* cited by examiner

*Primary Examiner*—Matt Kim
*Assistant Examiner*—Edward J Dudek
(74) *Attorney, Agent, or Firm*—Mark P. White

(57) ABSTRACT

A Flash memory system includes N flash devices, where N is an integer, each flash device having a flash device interface consisting of a control signal line, a R/B signal line, and a I/O signal line, and wherein each flash device has an operating speed of s. A logic block is connected to each flash device interface, and is further connected to a controller which whose interfaces also has a control signal line, a R/B signal line, and a I/O signal line, so that controller operates at an operating speed of N times s, and wherein the logic block controls each flash device simultaneously.

4 Claims, 21 Drawing Sheets

ADDRESS SEQUENCE

| Cycles | I/O 0 | I/O 1 | I/O 2 | I/O 3 | I/O 4 | I/O 5 | I/O 6 | I/O 7 | |
|---|---|---|---|---|---|---|---|---|---|
| 1st Cycle | A0 | A1 | A2 | A3 | A4 | A5 | A6 | A7 | Column Address |
| 2nd Cycle | A9 | A10 | A11 | A12 | A13 | A14 | A15 | A16 | Row Address (Page Address) |
| 3rd Cycle | A17 | A18 | A19 | A20 | A21 | A22 | A23 | A24 | |
| 4th Cycle | A25 | A26 | *L | *L | *L | *L | *L | *L | |

Fig. 4

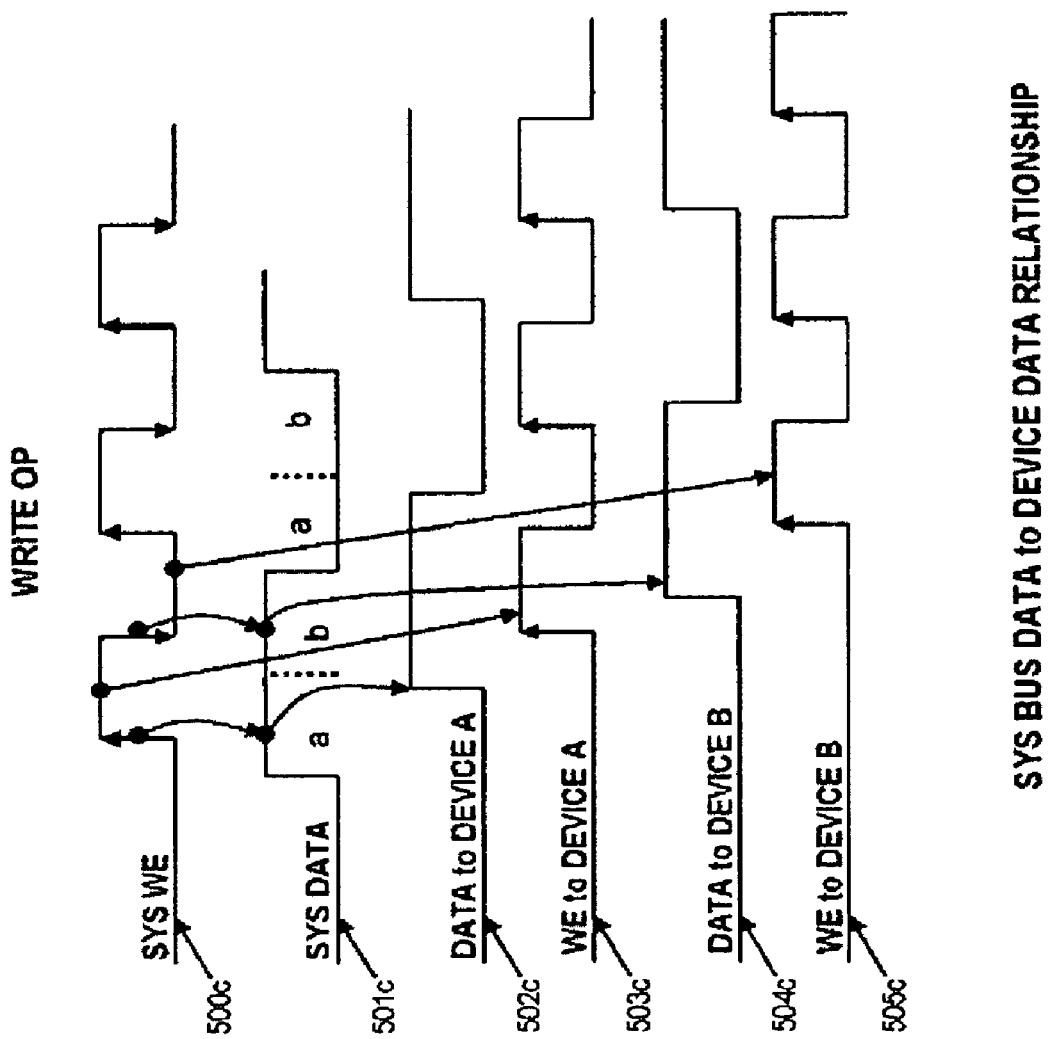

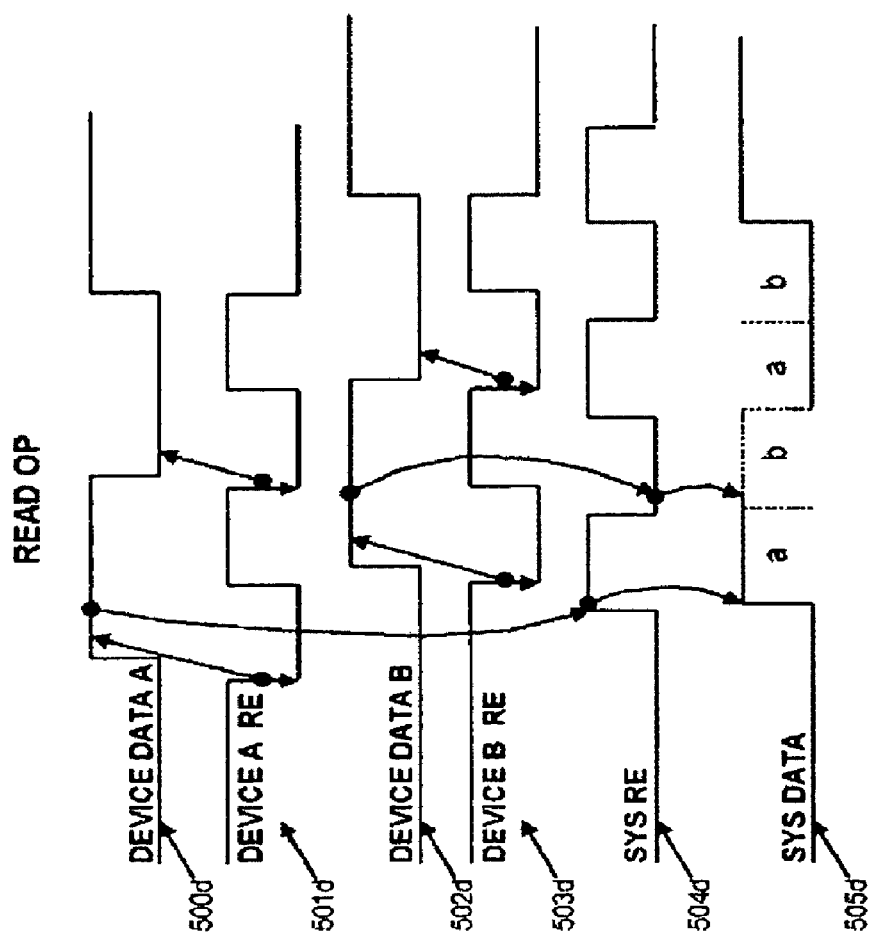

| ROW ADDRESS | ADDRESS and BYTE ORDERING SEQUENCE | | | | | | | |
|---|---|---|---|---|---|---|---|---|
| | BYTE LOCATION WITHIN THE ARRAY | | | | | | | |
| | A0 | A1 | A2 | A3 | A4 | A5 | A6 | A7 |
| 00000 | D0 | D1 | D2 | D3 | D4 | D5 | D6 | D7 |
| 01000 | D8 | D9 | D10 | D11 | D12 | D13 | D14 | D15 |
| 10000 | D16 | D17 | D18 | D19 | D20 | D21 | D22 | D23 |
| 11000 | D24 | D25 | D26 | D27 | D28 | D29 | D30 | D31 |

ARRAY = BLOCK PAGE

\# of ROWS per ARRAY = # of BYTES per SUB-REGISTER

\# of COLUMNS = # of SUB-REGISTERS

Fig. 12

HIGH PERFORMANCE DATA RATE SYSTEM FOR FLASH DEVICES

PROSECUTION HISTORY

This application claims priority based on Provisional Patent 60/740,846 (Dec. 1, 2005), for a "High Performance Data Rate for Flash Devices".

FIELD OF THE INVENTION

The present invention relates to providing increased data rates to the interface between the Controller and FLASH devices without increasing the speed of the individual FLASH devices.

In addition, rearranging the architecture of individual FLASH devices will result in overall increase in bandwidth of the device.

DESCRIPTION RELATIVE TO THE PRIOR ART

Terminology

Throughout this description the following terms are used:
FLASH=Non-volatile memory
NAND FLASH=type of FLASH architecture
BR=Bus Rate. The Bus Data Rate to be single or multiple of the Data Rate of a given Flash device.
BL=Burst Length
PCB=Printed Circuit Board.
LCC=Logic Control Chip.
MCM=Multi-Chip Module.
DIMM=Dual In line Memory Module.
SDRAM=Synchronous Dynamic Random Access Memory.
DDR=Double Data Rate. Data bit duration equals one half the period of the clock frequency. Two bits of data are used in a period of the base clock.
SDR=Single Data Rate.
DR=Data Rate. The data bit duration equal to one period of the base clock.
µ=microsecond=$1/10^6$ seconds.
nsec=nanosecond=$1/10^9$ seconds.
SBBR=System Bus Bit Rate.

For the purpose of description throughout this document, the term SBBR will be used. SBBR means that the Data Rate per bit in and out the Bus between the Controller and the LCC of the FLASH memory sub-system to be equal to the number of FLASH chips connected to the LCC multiplied by the Data Rate of one bit of the FLASH chip. If the Data Rate of one FLASH chip is x, then the Bus bit Data Rate for two devices will be 2x. In relation to time per bit, for example, if the bit time duration of a FLASH chip is 60 nanoseconds, and if two FLASH devices are controlled by the LCC, the bit duration for one data bit on the Bus will be 60/2 or 30 nanoseconds. If four FLASH devices are controlled by the LCC, the Bus bit duration will be 60/4 or 15 nsecs. In frequency terms, the FLASH device data bit frequency is $1/60$ nsec or 16.66 MHz and for four devices is $1/15$ nsec or 66.66 MHz.

CLE=Command Latch Enable. When this signal is valid, the data on the I/O pins is command information.

ALE=Address Latch Enable. When this signal is valid, the data on the I/O pins is Address information.

CE=Chip Enable. When this signal is valid, the data on the I/O pins would be allowed to be stored within the device. All other times the I/O pins are ignored. For a READ operation, the CE signal will allow the device to place valid data on the I/O from the internal blocks under control of the RE signal.

Some present FLASH devices use the Chip function Enable Don't Care CEDC.

The desire for increased throughput in a FLASH memory sub-system requires that the FLASH memory devices perform at higher speeds. Normally, a memory chip of a single Data Rate type SDR operating at a certain base frequency will produce Data Rate DR or one period of the base frequency. For a single device Bus interface the Bus rate BR will be equal the Data Rate DR of a single memory chip.

In order to increase the through put in a memory sub-system, memory chips of higher Data Rate or multi-Buses have to be used.

The present FLASH devices, due to the nature of the architecture and to the physical design constraints, they cannot perform at speeds equal to the present DDR SDRAM devices.

To better explain the present invention, the present FLASH device architecture will be described in detail.

A non-volatile memory device is the device that retains information for a long time.

Retention is the ability of the memory device to retain the information after the power to the devices has been disconnected.

The evolution of such devices has brought to the industry devices known as FLASH. They are CMOS devices with cell structures known as NOR and NAND.

FLASH devices retain information for long time without power and with the attributes of high density and low power.

Unfortunately that combination does' not quite meet today's expectations of fast Data Rate transfers. The density aspect has become somewhat satisfactory, but the speed of accessing data and transferring to the system Bus is slow by today's application requirements. It is even worst for writing data into the device core.

Herein, the focus will be on the NAND type Flash device architecture without exclusion of the NOR devices.

It is not the intent of this disclosure to bring out the differences between NOR and NAND but rather to describe methods by which the Data Rate on the Bus interface is multiples of the presently specified Data Rate of FLASH devices. It is the interest of this invention to exploit the NAND structure and describe methods for Data Rate increases.

In order to describe the new architectures, the present architecture and its limitations must first be understood.

The description below is for prior art FLASH devices.

An example of such device is the SAMSUNG part number K9K1G18R1B, titled 128 M×8 Bit NAND Flash Memory.

A block diagram of this device is shown in FIG. 3 and its connection to a Controller is shown in FIG. 3*a*.

Besides the memory blocks, each device has incorporated in the same silicon the control logic to write, read and erase data and logic to process address and commands.

Commands and data from the Controller to the device and vise versa are communicated through the I/O interface 300. They are under control of the Control lines CE (Chip Enable), CLE (Command Latch Enable), ALE (Address Latch Enable), WE (Write Enable), RE (Read Enable). The I/O Bus width could be 8 or 16 bits wide.

Referring to FIG. 1, a block of NAND cells is shown. The NAND device has multiples of cell blocks of memory.

A block of the memory core consists of 32 pages, 0 to 31. Each block of 32 pages is partitioned in two areas, the main memory area 100 and the spare area 101. A block page 102 of the main area shown holds 512 bytes of data. Each page in the spare area 101 holds 16 bytes for support information such as Error Correction and bad block information.

The main data area is partitioned in two equal core areas 104 and 105 of 256 bytes each.

A 528 byte data register 103 and 106 is connected to memory cell arrays accommodating data transfers between the memory and I/O buffers during page READ and page program WRITE operations.

The density of the Flash device is determined by the number of blocks it has.

In today's devices, the I/O interface for data can be either byte (8 bits) wide shown in FIG. 1, or word (16 bits) wide shown in FIG. 2.

The address and commands use only the first 8 bits of the I/O interface.

Any information written into the device is under the control of the Write Enable (WE) line and any information read from the device is under the control of the Read Enable (RE) line.

The Command information in the I/O buffer is under the control of the Command Latch Enable, (CLE), and the WE lines.

The Address information in the I/O buffer is under the control of the Address Latch Enable, (ALE), and the WE lines.

A command, also, identifies in which section of the page register the starting address is applied to.

Now referring to FIG. 2, the block is shown for 2 byte (word) interface. The commands on the two byte I/O are sent only on bits 0 through 7, while data to be written to the device is sent on all I/O, bits 0 through 15. During WRITE or READ operation for data, two bytes of data appear on all sixteen I/O under the control of the RE and WE lines.

Now referring to FIG. 3, a Functional Block Diagram is shown for better understanding of the present construction of the flash device. The functional block will be altered for other architectures without diminishing the intent.

For a single FLASH device, the interface of the device to the controller is shown in FIG. 3a.

Referring to FIG. 4, the Address of the array, based on the present interface, is passed onto the flash device by the external controller in a predetermined sequence per cycle as determined by the WE and RE control lines.

Referring to FIG. 5, the timing diagram shows how the interface is working in present FLASH devices for a WRITE Op. The Commands, Address and Data information transfer from the controller into the device is controlled by the strobe signal WE.

The programming of the information into the array is initiated by a Program Command shown as PROG CMD. During programming, the device is busy and activates the R/B line to tell the controller that the operation has not yet completed. Upon completion of the operation, the device makes the R/B signal inactive. The controller can then start a new operation to the device.

Referring to FIG. 6, the timing diagram shows how the interface is working in present FLASH devices for a READ Op.

Presently, there is no Burst Length, (BL), information sent to the device to control data stream and when the next operation could start. The device depends on the Controller to initiate appropriate action through commands and control lines.

The above description of the operation of the present devices is part of the prior art.

There are other commands and operations, such erase, not mentioned here. The omission is not reducing the importance of this invention.

SUMMARY OF THE INVENTION

It is the general object of this invention to provide a FLASH memory sub-system architecture where the Bus Data Rate DR is a multiple of the Data Rate DR of individual FLASH devices operating at their specified SDR.

In accordance with one aspect of the current invention, A FLASH memory sub-system with a data Bus and Control lines includes a first FLASH memory chip of a specified architecture with interface having Data I/O Bus lines and Control lines; a second FLASH memory chip of the same architecture as the first with interface same as the first having Data I/O Bus lines and Control lines; and Write Enable and Read Enable control lines for write and read operations functioning as clocks on demand having a multiplicity of cycles, each having a start and a period p; the validity of the Data I/O lines from the devices lasts for full period p of the controlling line. In addition, for a Read operation, the system includes a first switching means connecting to the system Bus Data I/O lines the Data I/O lines of the first FLASH chip at the start of the cycle and lasting for a time p/2 of the cycle of the controlling line, and a second switching means connecting to the system Bus Data I/O lines of the second FLASH chip at the start of the second half of the first cycle and lasting for a time p/2 of the cycle of the controlling line and the process is repeated as needed. Connection of the Bus Data I/O lines and Control lines is done by receivers, latches and drivers in the switching means with directional controls.

In accordance with a second aspect of the current invention, the system Bus comprises Data I/O Bus and Control lines similar in function to the Data I/O and Control lines of the individual FLASH chips with Write and Read Enable Control lines; one end of the system Bus attaches to pins of a memory Controller and the other end attaches to pins or circuits of the switching means that control the individual FLASH chips; In addition, the system Bus Control lines for Write and Read operations function as clocks on demand having a start and a period p equal in time to the period p of the devices. The validity of the Data lines on the system Bus lasts for time p/2 of the first cycle for the first FLASH device and the second p/2 of the first cycle for the second FLASH device.

In accordance with a third aspect of the current invention for a Write operation, the Write Enable control line acts as a clock on demand with period p. The first Data bit having validity p/2 of the first half of the period p is destined for the first FLASH device and the second Data bit having validity p/2 of the second half of the first period p is destined for the second FLASH device. The order of the devices could be reversed without departing from the invention. Both Data bits of each period p are first received and latched in the switching means, then, they are expanded in duration to match the duration of period p of the devices and subsequently presented to each destined device under control of the Control lines comprising the interface of each device. In addition, the Control interface connected to the devices is regenerated from the controls of the system Bus by the switch means, timed accordingly and then applied to each attached device.

In accordance with a fourth aspect of the current invention, the switching means are comprised of feed through bi-directional FET switches, one per data bit, each having a first I/O port and a second I/O port without latching and re-driving circuits. A first port of the first FET switch connecting to the system I/O Bus, a first port of the second FET switch connecting to the first port of the first FET switch, a second port of the first FET switch connecting to the first FLASH device I/O Bus, a second port of the second FET switch connecting to the second FLASH I/O Bus. Each FET switch has individual control ports for directionality and enablement supplied by the Controller or other means.

In accordance with a fifth aspect of the current invention, the system includes a motherboard, the first FLASH chip, the second FLASH chip, the switching means and the Controller are all located on the motherboard.

In a sixth aspect of the invention, the first FLASH device, the second FLASH device and the switching circuits and controls are located in a single multi-chip module MCM. Said MCM comprises I/O pins or connecting pads for connecting to I/O pins of a Controller on a motherboard, on a DIMM or on the same or different MCM. In addition, all of the required components of the FLASH memory sub-system can be manufactured as one silicon substrate.

In a seventh aspect of the invention, eight FLASH devices could be used provided the arrangement is not limited by I/O pins and frequency requirements of the switching means and real estate on the motherboard or MCM. I/O ports in the switching means could be multiplexed between devices to reduce pin count.

In a eighth aspect of the invention, a first FLASH chip, a second FLASH chip, a third FLASH chip and a fourth FLASH chip each of the same architecture with similar I/O and Control interfaces capable of operating with the same speed and throughput bandwidth comprise one part of a memory sub-system. A switching means of providing four identical I/O ports, one for each device, connects to I/O port of each FLASH device. A fifth I/O port of the switching means connects to the system Bus of the Controller. The Write and Read enable control lines of each device having a period p act as clocks on demand. The valid time of each data bit to and from each FLASH device is equal to the period p of the Write and Read enabling lines of the devices. The Write Enable and Read Enable control interface, from the switching means to the Controller, has a new period $Pn=p/2$ of the device Write and Read Enable line period. The valid time of each Data bit on the system Bus is equal to $Pn/2$ of the system Bus Write and Read Enable lines or $p/4$ of the device Write and Read Enable line period. For a Read operation, each FLASH device provides the data on its I/O data Bus, the data is latched in the switching means and only a quarter valid portion of each Data bit from each device is sampled from the latches and sent out to the system Data I/O Bus under control of the system Read Enable Control line. For a Write operation, the data bits on each Data I/O line are under control of the Write Enable line Pn period of the system Bus. Each Data bit in time is equal to $Pn/2$. For the first Pn period, the first half of the period controls the first bit to be latched in the switching means, expanded in valid time and delivered to the first FLASH device under control of the device Write Enable line. In a similar manner, the second Data bit under control of the second half of the first period Pn is delivered to the second FLASH device under the control of the Write Enable line for that device. The third Data bit which is controlled by the first half of the second period Pn, in a similar manner is delivered to the third FLASH device and the fourth Data bit which is controlled by the second half of the second period Pn is delivered to the fourth FLASH device. The process repeats until all data is written into the devices.

In a ninth aspect of the invention, a FLASH device architecture comprises:

a 32 page block of main core memory, a subdivision of the main core block to sub-blocks from 1 to n, n limited by physical and design constraints, a sub-division of each block page registers, having inputs and outputs, to sub-pages from 1 to n and each sub-page register connected with one side to corresponding sub-block core and with the other side to a buffer output, a multiplicity of buffer clusters each having inputs and outputs the width of the interface I/O buffers, and each buffer cluster having an input port and an output port with its output port connected to the corresponding inputs of the sub-page registers, the input of each buffer cluster multiplexed with the inputs of all other cluster buffers by a multiplexer in a logic circuit block and with the multiplexer inputs having width equal to the I/O buffer outputs connected to the I/O buffer outputs through the logic block. All logic functions and controls provided by the logic block. The I/O buffers having a specified width serve as the means of providing bi-directional path of the Data to and from the Controller and to and from the internal paths through the logic block. The external to device interface Controls are part of the system Bus.

BRIEF DESCRIPTION OF THE DRAWINGS

These, and further features of the invention, may be better understood with reference to the accompanying specification and drawings depicting the preferred embodiments, in which:

FIG. 4 depicts the address sequence and structure for Column and Row addressing of the core of the prior art.

FIG. 5*c* depicts in diagram form the System Bus data to Device Data relationship for a WRITE operation of the proposed invention FIG. 5*d* depicts in diagram form the System Bus data to Device Data relationship for a READ operation of the proposed invention.

FIG. 12 depicts in table form the proposed structuring of byte location within the block page of the array as proposed in this invention.

DESCRIPTION OF THE PREFERRED EMBODIMENTS

Figure 3:
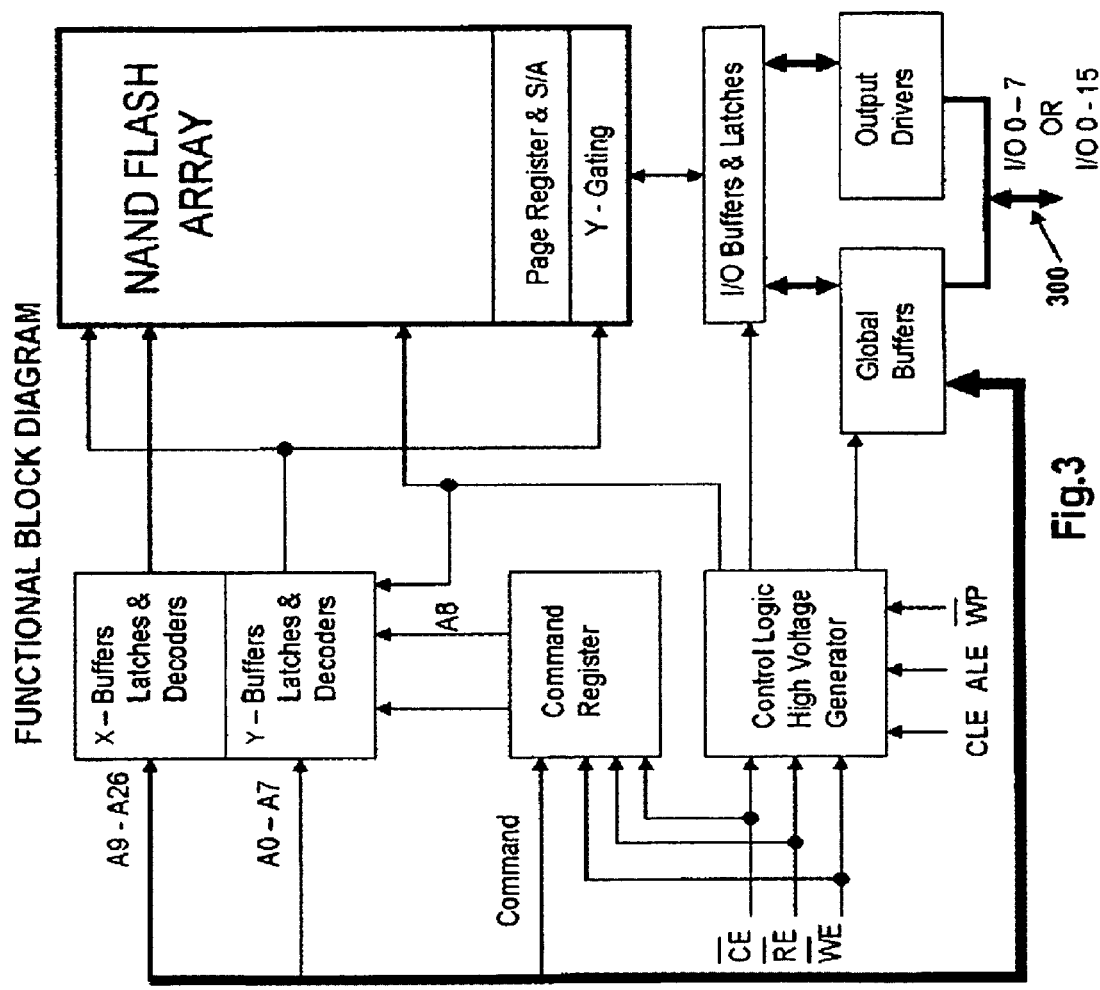
FIG. 3 depicts a typical internal block diagram of the prior art FLASH device
Figure 3A:
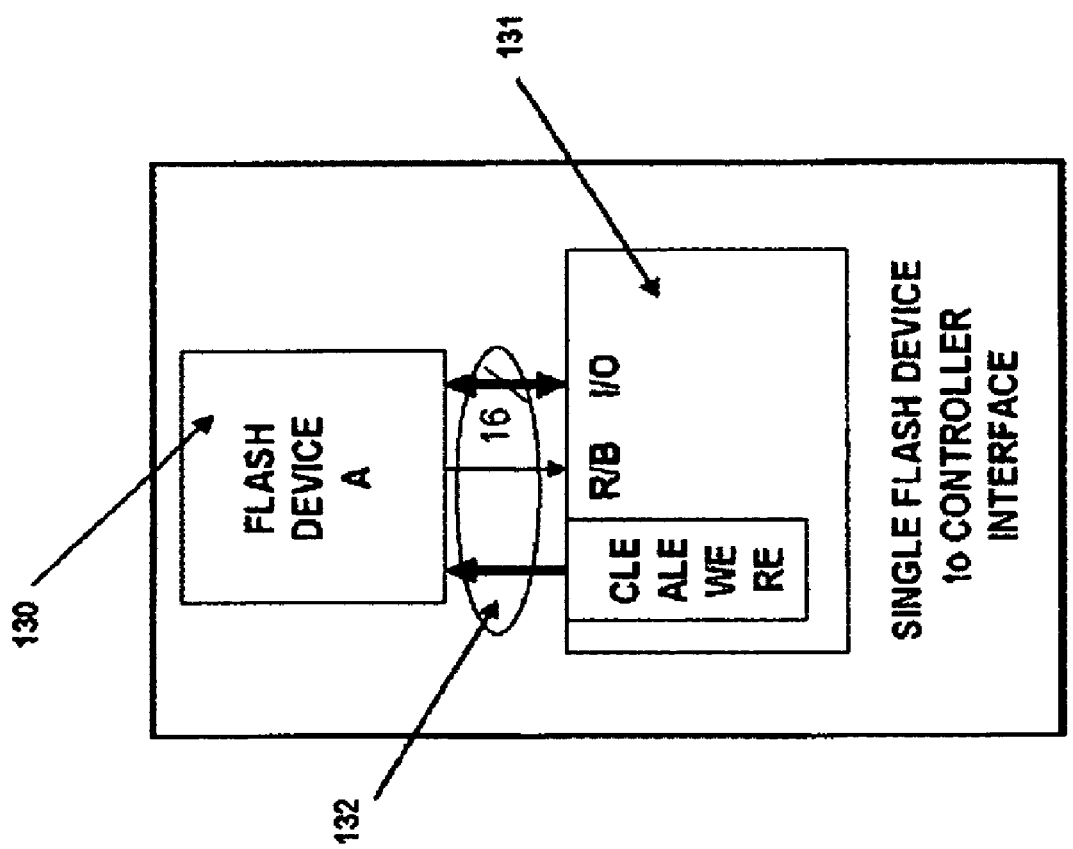
FIG. 3*a* depicts the interface components of the prior art FLASH device and the Controller.

In FIG. 3a, a prior art single FLASH device 130 and the Controller 131 is shown. The interface 132 shown as 16 bits wide, along with the control lines is controlled by the Controller, except the R/B (Ready/Busy) line that is controlled by the FLASH device. The data date of the interface is that of the device as specified.

The invention would be better understood by a detailed description and reference to individual drawings.

Description of the First, Second and Third Preferred Embodiments

Figure 7:
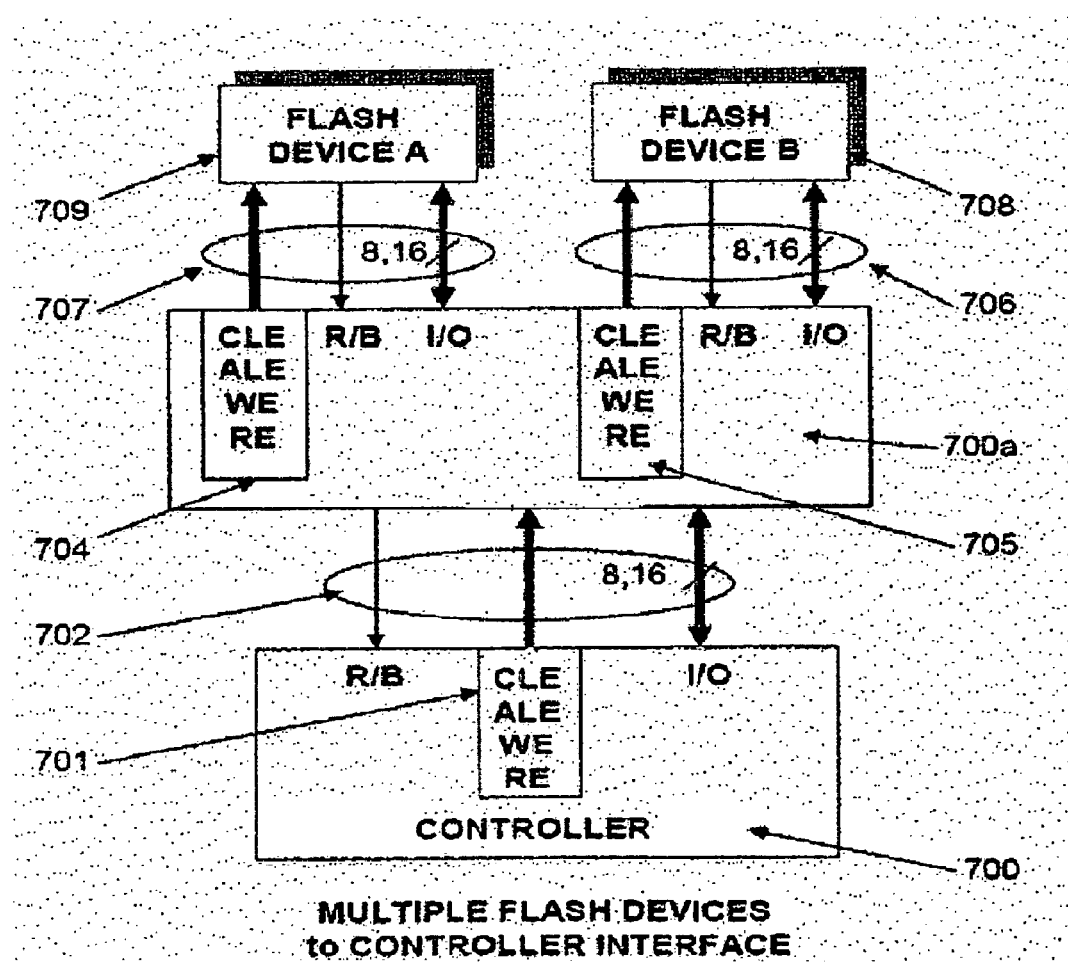
FIG. 7 depicts in block diagram form the System Bus Interface from Controller to means of switching and the interfaces from means of switching to multiple FLASH devices in the proposed invention.

Referring to FIG. 7, two of the same FLASH devices 130 as in FIG. 3a are used. The interface of the devices is not changed neither their Data Rate.

The arrangement includes two FLASH devices 708 and 709 connected to another logic block 700a that controls the interfaces to devices and to the Controller 700. The logic block 700a, also, controls the Data Rate conversion from high Data Rate of the system bus to half the rate required by the devices attached. The logic block provides all the timing functions and regeneration of the control signals 704 and 705 as architected for the FLASH devices 708 and 709. The tWC 600 and tRC 601 periods shown in FIG. 6 for the device interfaces 706 and 707 and the tWC 500 and tRC 501 of FIG. 5b periods for the interface 702 are the same for the arrangement of two FLASH devices shown in FIG. 7. The difference is, that for interface 702 two bytes of information is transferred in one period instead of one byte as required for the devices. The Logic block provides re-driving capabilities for control signals and clock generation for source synchronous applications as required.

The devices shown in FIG. 7 could be individually placed on a printed circuit board and connected accordingly. They could, also, be encapsulated in one package as discrete packaged devices, shown in FIG. 16, or in bare silicon form connected by bonding wire techniques or other available means of interconnecting. The resulting package will occupy less space on the circuit board and will operate at double the Data Rate of a single device.

In FIG. 7 three interfaces 702, 707 and 706 are shown. Interfaces 707 and 706 are similar in timings and data rates. Interface 702 is the new system high Data Rate interface.

Although FIG. 7 depicts two flash devices, the scheme can clearly be extended to any number of flash devices, connected to a single logic block. However, the most obvious practical configuration is for the number of flash devices in this system to equal a number equal to $2^n$; that is 2, 4, 8, 16, etc.

Figure 5:
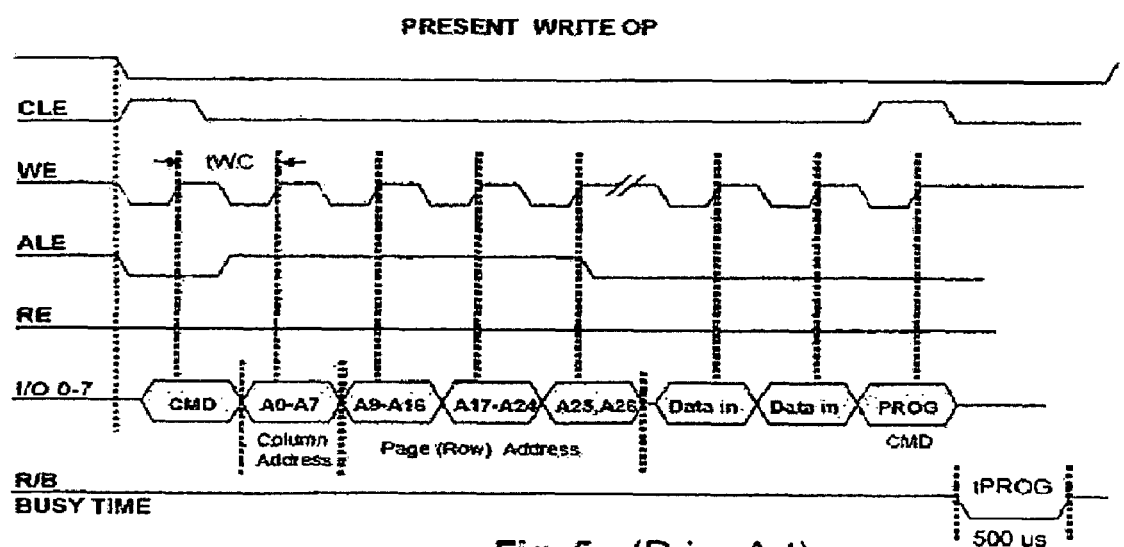
FIG. 5 depicts in diagram form the total sequence for the device WRITE operation function of the interface of the prior art.
Figure 6:
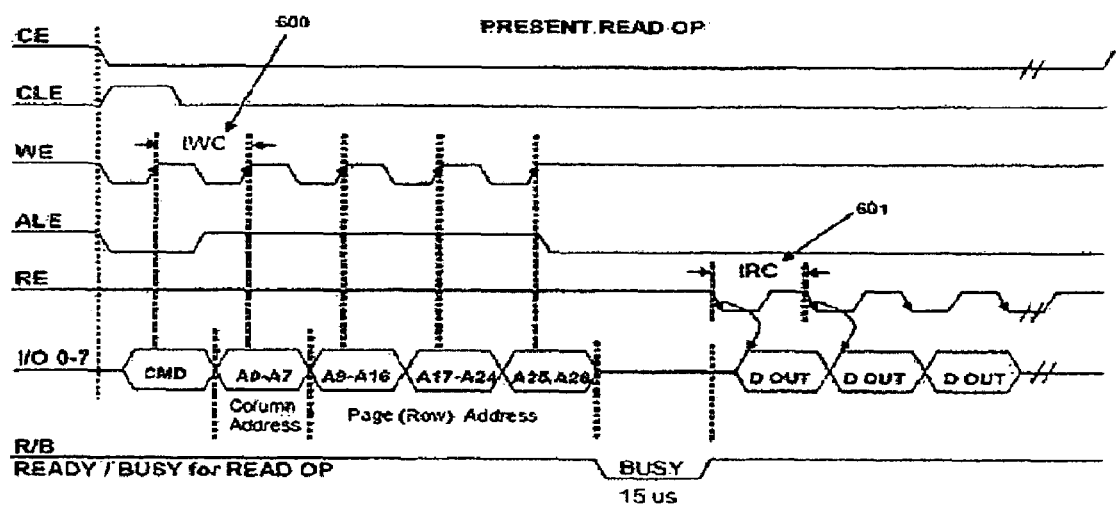
FIG. 6 depicts in diagram form the total sequence for the device READ operation function of the interface for the prior art.

To better explain the different interfaces and data rates, reference will be made to device specified operations as shown in FIG. 5 and FIG. 6.

For a WRITE operation shown in FIG. 5, the rising edge of the WE signal latches the information in the device latches.

For a READ operation shown in FIG. 6, the falling edge of RE signal brings the data out of the device latches and onto the system bus, while the rising edge of the RE signal latches the information in the Controller latches.

The specification for the device defines the frequency of the WE and RE signals along with the presentation and the duration of the command and data signals to and from the FLASH device.

It is obvious that only one byte of command or data, or two bytes of data for a 16 bit data bus, information becomes available for every cycle of WE (tWC) or RE (tRC).

Unfortunately, the Data Rate can only be increased if the device becomes faster by specification.

Referring to interfaces 702, 707 and 706 of FIG. 7, a method would be described by which the system Data Rate doubles while the Data Rate of the FLASH devices remains as specified.

Each FLASH device 708 and 709 in FIG. 7, must receive the specified sequence of command, address and data signals at the rates specified as shown in FIG. 5 and FIG. 6 timing relationships.

In FIG. 5 and FIG. 6 the signal relationships are shown for WRITE and READ operations as prior art specification. Only one transfer of data occurs in one cycle of WE or RE.

Figure 5A:
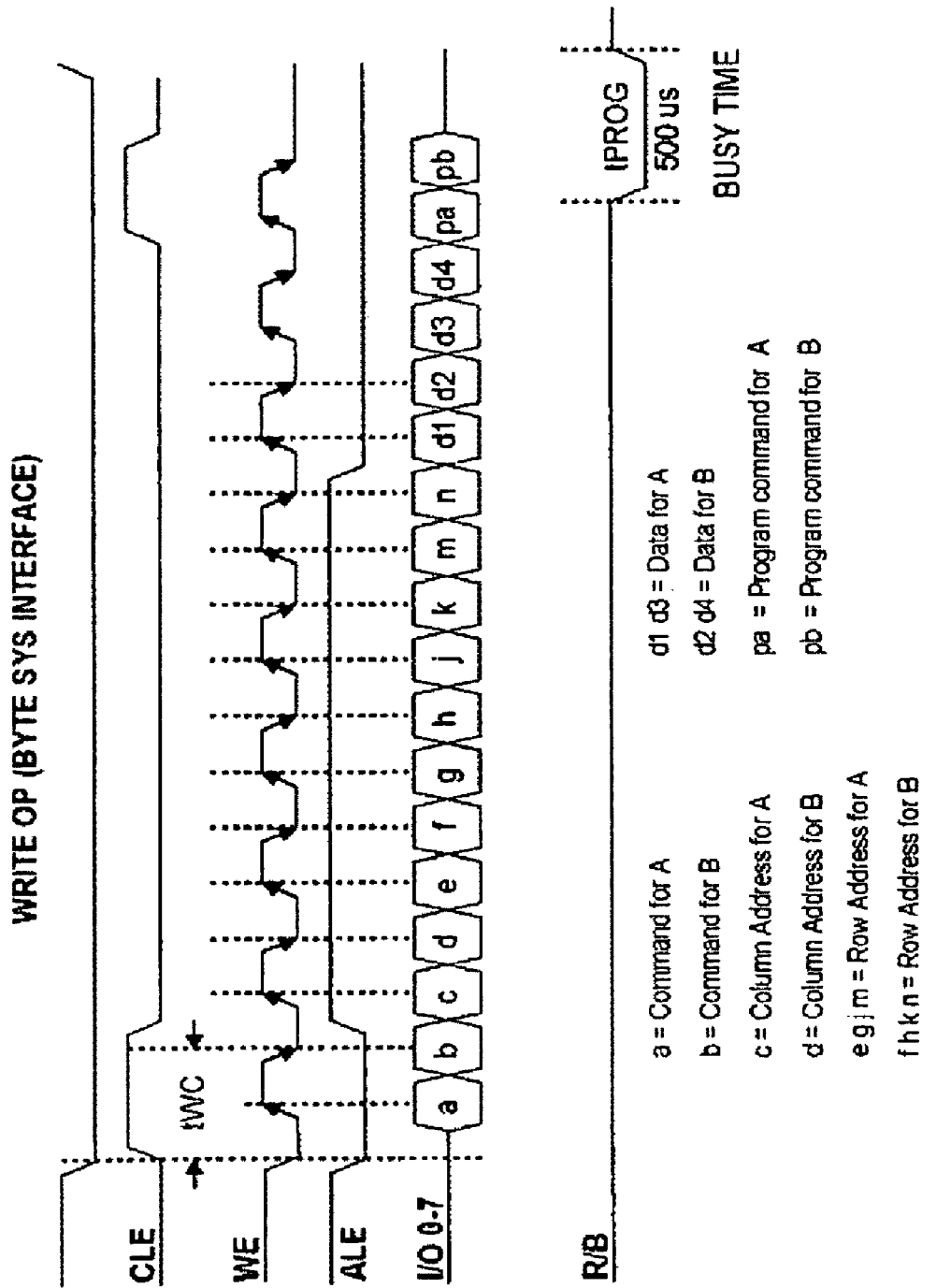
FIG. 5*a* depicts in diagram form the total sequence of the proposed invention WRITE operation function of the interface.
Figure 5B:
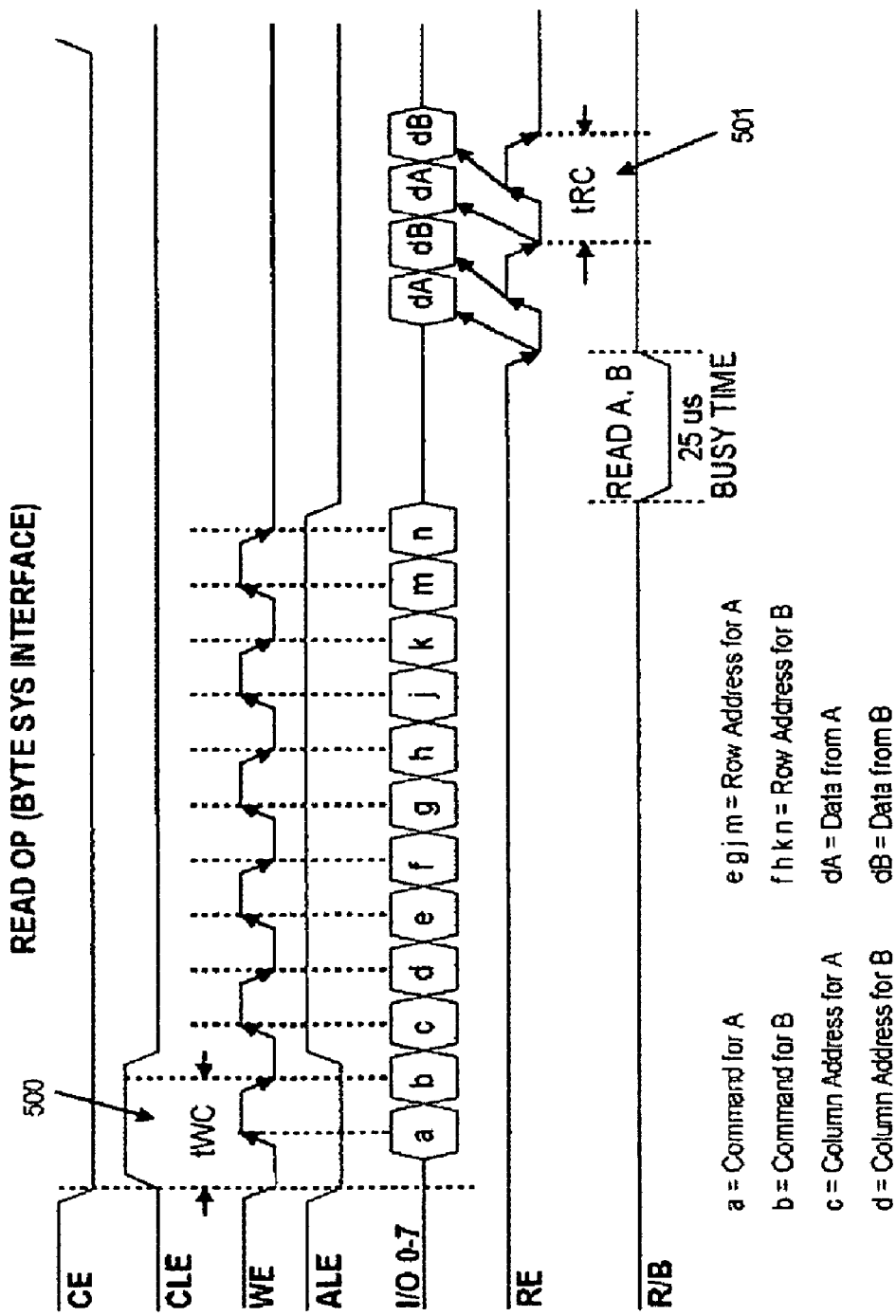
FIG. 5*b* depicts in diagram form the total sequence of the proposed invention READ operation function of the interface

To better explain the system interface and its relationship to the device interface, reference is made to FIG. 5a, FIG. 5b and FIG. 7. The sequence of command, address and data transfers is the same as it is specified for the devices.

Now referring to FIG. 7 and FIG. 5a, two bytes of information is sent to the logic block 700a from controller 700. There are two command bytes one for device A 709 shown in FIG. 5a as (a) and one for device B 708 shown as (b). There are two column address bytes one for device A shown in FIG. 5a as (c) and for device B shown as (d). There are two sets of row addresses one for device A shown in FIG. 5a as (e g j m) and for device B shown as (f h k n). The contents may be the same for device A and device B or may be different, as long as the controller keeps tack of it.

The control signals shown in 701 are regenerated 704 for device A and 705 for device B. For device B, all of the signals, control and data, are delayed in relation to the ones for device A. The amount of delay is adjusted to meet required specifications.

In one aspect of the invention, the interfaces 702, 706 and 707 are identical in number of signals and functions.

In another aspect, interface 702 may include additional signals for improved performance characteristics. Such signals may be clocks and strobes in a single phase or they may be differential.

The interface for devices A will be the same as for device B.

To further explain the invention, reference is made to FIG. 7 and FIG. 5a for a WRITE operation and to f FIG. 5b or a READ operation. For interface 702 there is transfer of data with every rise and fall edge of the control signals WE and RE.

Since there are two devices involved in the configuration, two pages or two blocks, one from each device, are accessed at the same time with minor delay offset to device B. The address of each page or block may or may not be the same for both devices and is controlled by the Controller logic.

Page WRITE Op.

Command phase: During Command Latch Enable CLE time, one of the WRITE commands is sent out by the Controller 700 twice to the logic block 700a. If the address is the same for both devices it could be sent once for the full CLE time. These are bytes a and b in FIG. 5a. The Logic Block latches each command and directs it to the interfaces 707 and 706 per specification timings.

Address phase: During Address Latch Enable ALE time, the Controller sends out Column Address for device A and device B in one WE cycle. These are bytes c and d in FIG. 5a. Subsequently, the Controller sends out the required Row Address bytes for the devices in an alternating fashion. These are bytes e g j m for device A and f h k n for device B in FIG. 5a.

Data phase: With the Command Latch Enable CLE and Address Latch Enable ALE signals inactive, the Controller sends out data to the Logic Block in an alternating fashion for each device. These are bytes d1 d2 d3 d4 in FIG. 5a.

As the data is received by the Logic Block, it is transferred to respective devices at device specified speed using the device interface.

The end of the transmission of data is followed by a command to execute the program operation. During the CLE time the two program commands pa and pb are sent to respective devices.

Each device takes the pre-determined time to complete the program operation into the memory core. For the devices, such as SAMSUNG K9K1G08R0B in this explanation, 500 micro-seconds total time is required. Both devices operate simultaneously.

It is obvious that twice the amount of data is written at the same time it takes one device in a single configuration shown in FIG. 3a to write one half of the total data transmitted.

The total Command and Address time has not been increased since tWC has remained the same as specified for the devices.

Page READ Op

The command sequence for page READ is the same as it is for page WRITE. It is shown in FIG. 5b.

However, the devices will take internal time to bring the data out of the memory and into the page registers respectively. This time is shown in FIG. 5b to be 25 microseconds for the device chosen for the explanation. During that time a busy signal is activated by the R/B line and the Controller waits.

After the removal of the busy signal R/B, the devices send the data out to the Logic Block 700a and said data is latched into respective latches for each device. Then the data is transferred out of the Logic Block and onto the interface 702 at twice the specified rate of the devices, two bytes per RE period tRC, and under control of the RE signal. The relationship is shown in FIG. 5b. The Controller receives the data with each edge of the RE signal. The RE signal is under control of the Controller. Provision is made to use a separate clock edge to latch the data into the respective data latches during data valid time, or use a delayed version of RE to adjust for latching.

The tWC in FIG. 5 and tWC in FIG. 5a and tRC in FIG. 5b are of the same frequency.

The interfaces 706 and 707 are shown in FIG. 5 for a WRITE op and FIG. 6 for a READ op in waveform type. Similarly, the interface 702 is shown in FIG. 5a and in FIG. 5b.

Referring to FIG. 5c, the relationship of the SYS Bus data and SYS WE signals is shown. Rising edge of WE 500c clocks data 501c into a latch and the output of the latch presented as data 502c to device A. The WE 503c is regenerated from 500c and is presented to device A in the proper timing relationship to the respective data 502c. Falling edge of WE 500c clocks data 501c b into a latch and the output of the latch presented as data 504c to device B. The WE 505c is regenerated from 500c and is presented to device B in the proper timing relationship to the respective data 504c.

Referring to FIG. 5d for a READ Op, the relationship of the device data and device RE is shown. Device A data 500d is clocked into a latch in the Logic Block by RE 501d falling edge. Device B data 502d is clocked into a latch in the Logic Block by RE 503d falling edge. Then data 500d and 502d is sampled by RE 504d and is presented on the system bus as data 505d along with RE 504d. The timing relationships are adjusted to meet system and device specifications for setup timings.

In the arrangement of FIG. 7, there are two devices used. The total capacity of memory is doubled and so is the overall block size. Effectively, there are 64 pages in this new block, 32 pages in each device. The overall WRITE and READ time for this new block is the same as the one required for a single block with 32 pages. Both blocks are written or read at the same time. With this method one can double the memory capacity and double the performance. In another aspect of the invention, n (n=even number and larger than 2) devices could be used and with the controlled signal, WE and RE adjusted accordingly to meet the higher data rates.

The requirement is that Blocks must be used in pairs, one from each device. The blocks may or may not have the same address. It is the responsibility of the controller to keep track of the block addresses used as pairs. During address time the address for each device block is distinct.

The density of the devices used and the width of I/O do not depart from the invention subject matter.

The discussion of the invention assumed that the Controller controls the device by use of the interface signals.

Description of the Fourth Preferred Embodiment

In accordance with a fourth aspect of the current invention, the switching means of the LCC chip are comprised of feed through bi-directional FET switches, one per data bit, each having a first I/O port and a second I/O port without latching and re-driving circuits. A first port of the first FET switch connecting to the system I/O Bus, a first port of the second FET switch connecting to the first port of the first FET switch, a second port of the first FET switch connecting to the first FLASH device I/O Bus, a second port of the second FET switch connecting to the second FLASH I/O Bus. Each FET switch has individual control ports for directionality and enablement supplied by the Controller or other means. Controls for the FET switches can, also, be generated by the LCC chip. Such Controls are Enablement, Directional and Delay signals to be applied for each FET switch accordingly. Same type of FET switches will be used for the other Bus Control signals CLE, ALE, WE, RE, R/B. The system interface Bus 702 can be used with multiple drop off points where same arrangements of the switching means 700a and devices 708 and 709 ca are attached. Isolation of each cluster of said devices from the main interface 702 by the FET switches reduces the capacitive loading on the interface. The result is that the main Bus interface 702 will operate at higher Data Rates.

Description of the Fifth Preferred Embodiment

In accordance with a fifth aspect of the current invention, the system includes a motherboard, the first FLASH chip, the second FLASH chip, the switching means and the Controller are all located on the motherboard.

Individual arrangements of FLASH chips and Controller as shown in FIG. 7, or clusters of FIG. 7, or a single Controller with multi-drops can be located on a PCB of a motherboard or on the PCB of a DIMM to facilitate multi-channel operations for higher bandwidth.

Description of the Sixth and Seventh Preferred Embodiments

In accordance with a sixth and seventh aspects of the current invention, the system includes a MCM, the first FLASH chip, the second FLASH chip, the LCC switching means and the Controller are all located on the MCM and said one or more MCM located on different MCM.

Individual arrangements of FLASH chips and Controller as shown in FIG. 7, or clusters of FIG. 7, or a single Controller with multi-drops can be located on the same MCM to facilitate multi-channel operations for higher bandwidth. The MCM package will provide I/O pins and can be treated as a single FLASH device with higher performance for a single channel or multi-channel connections on the PCB of a motherboard or on a PCB of a DIMM.

Description of the Eighth Preferred Embodiment

Figure 16:
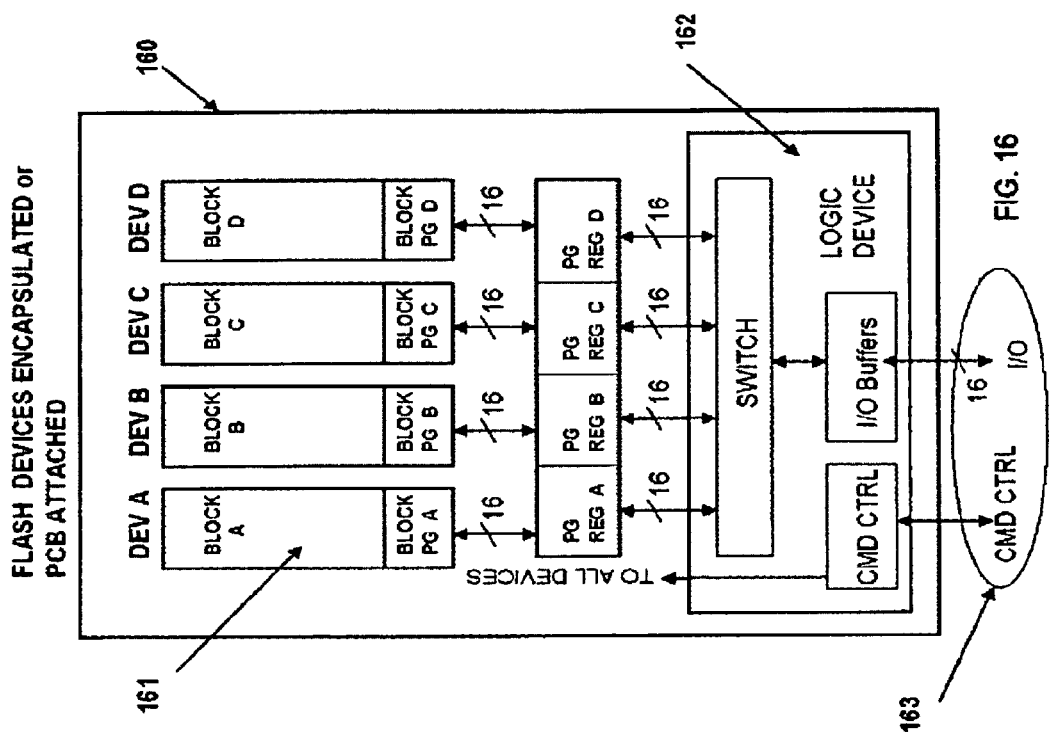
FIG. 16 depicts in block diagram form four FLASH devices encapsulated into one package that includes the switching means and logic block of the proposed invention.

Referring to FIG. 16, item 160 is a PCB portion of a motherboard or an MCM packaged device or a single silicon substrate that contains individual four FLASH devices 161 designed on the same silicon substrate, or individual Blocks of the same silicon device and one device 162 or silicon portion of the same silicon device or substrate.

For this example, Devices 161 A, B, C, D, will be considered as individual silicon Flash devices as designed in prior art. Device 162 is and individual logic block to provide switching and control means.

Device 162 would be a silicon chip that contains the interface logic, Data I/O, Command and Controls for the System I/O bus to the Controller and for the interface to the Flash devices.

The width of the System Bus interface and to the device interface could be any number of bytes that is suitable for the application.

In prior art architecture for a single FLASH device, and as shown in FIG. 5, the sequence is to send the CMD first and then the Column address and then the page (Row) address to select the block and page.

When multiple devices as in FIG. 16 are used, to spread the data to all devices, the following should be observed.
   a) The primary Command to be the same for all Flash devices.
   b) The Column Address to be the same for all pages selected or different. If different, the number of Address cycles will increase.
   c) The block and page Address to be the same or different for each Flash device. If different, the Controller decides which blocks are parts of the same group and the number of transmission cycles will increase.

In FIG. 16, a first FLASH chip A, a second FLASH chip B, a third FLASH chip C and a fourth FLASH chip D each have the same architecture with similar I/O and Control interfaces capable of operating with the same speed and throughput bandwidth.

The switching means 162 provides four identical I/O ports, one for each device, and each I/O port connects to each FLASH device.

A fifth I/O port of 163 connects to the System Bus of the Controller.

The WE and RE control lines of each device having a period p act as clocks on demand for WRITE and READ operations. The valid time of each data bit to and from each FLASH device is equal to the period p of the WE and RE lines of the devices. The WE and RE signals of interface 163 from the switching means 162 to the Controller, has a new period Pn=p/2 of the device 161 period.

The valid time of each Data bit on the System Bus 163 is equal to Pn/2 of the System Bus WE and RE lines or p/4 of the device WE and RE period.

For a READ operation, each FLASH device provides the data on its I/O Data Bus, the data is latched in the switching means 162 and only a quarter valid portion of each Data bit from each device is sampled from the latches and sent out to the System Data I/O Bus pin under control of the System RE Control line. Similar timing diagram for two devices is shown in FIG. 5d.

For a WRITE operation the data bits on each System Data I/O lines are under control of the WE line Pn period of the System Bus. Each Data bit in time is equal to Pn/2 of the Pn period. The first half of the period controls the first bit to be latched in the switching means 162, expanded in valid time and delivered to the first FLASH device under control of the device WE line frequency. In a similar manner, the second Data bit under control of the second half of the first period Pn is delivered to the second FLASH device under the control of the WE line for the second device. The third Data bit which is controlled by the first half of the second period Pn, in a similar manner is delivered to the third FLASH device and the fourth Data bit which is controlled by the second half of the second period Pn is delivered to the fourth FLASH device. The process repeats until all data is written into all devices. Similar timing diagram for two devices is shown in FIG. 5c.

Because all the blocks in each Flash device may not be usable, using the same address across all devices may not be applicable. In such a case, the address of the blocks participating in this scheme requires a modification. If this is the case, the following is proposed.

In the stream of Commands, additional attribute bytes could be inserted. Such attribute bytes could contain indications such that page addresses are to follow for different devices. If there are no address modifications, then, the same page address belongs to all devices. The structure of the modification bits is not the object of this invention. The Controller would need to have prior knowledge of the valid block addresses in each Flash device. Such information is furnished presently in the spare section of each block by the manufacturer with each device shipped.

If a block becomes defective during the operation, the Controller decides to rearrange the block assignment.

The structure of the address modification attribute bits could be an integral part of the Command itself to avoid additional time used for a separate transmission. In an 8 bit command byte, each WRITE and READ command would be one or more of the 256 bit combinations to indicate to the control logic how to treat the address information.

In a system where the I/O bus is wider than a byte, the command byte could remain as presently used and one or more of the other bytes to be used for attributes of address modification and of functional changes. This would speed up the information transfer to the device interface. For example, in a two byte interface, the first byte to contain the command as presently used and other commands not yet specified. The other byte to be the Column address or how many row addresses would be transmitted and for which device or devices. Since the Column address is not affected by which block is selected, it may be appropriate to have the command and column address transmitted with the first two bytes. Then, the next two bytes could be used as modification attributes to the row address or addresses to follow.

Another method would be to separate the Address and Control information bus from the I/O data Bus.

Description of the Ninth Preferred Embodiment

In a ninth aspect of the invention, a FLASH device architecture comprises;

a 32 page block of main core memory, a subdivision of the main core block to sub-blocks from 1 to n, n limited by physical and design constraints, a sub-division of each block page registers, having inputs and outputs, to sub-pages from 1 to n and each sub-page register connected with one side to corresponding sub-block core and with the other side to a buffer output, a multiplicity of buffer clusters each having inputs and outputs the width of the interface I/O buffers, and each buffer cluster having an input port and an output port with its output port connected to the corresponding inputs of the sub-page registers, the input of each buffer cluster multiplexed with the inputs of all other cluster buffers by a multiplexer in a logic circuit block and with the multiplexer inputs having width equal to the I/O buffer outputs connected to the I/O buffer outputs through the logic block. All logic functions and controls provided by the logic block. The I/O buffers having a specified width serve as the means of providing bi-directional path of the Data to and from the Controller and to and from the internal paths through the logic block. The external to device interface Controls are part of the System Bus.

It is the object of this invention to describe methods by which data transfer to the flash device is sent at rates multiples of powers of 2 of the rate described in the specification of the present device. If we designate the specified device Data Rate to be 1×, then the Data Rate on the Bus will be 2×, 4×, 8×, etc. It depends on the partition of the block into sub-blocks of power of 2, or applied to multiple, equal to powers of 2, devices connected and encapsulated in the same package with the appropriate control logic integrated within the Flash silicon or in discrete silicon in the encapsulated package. Other multiples, 6×, 10× that are not integral powers of 2 could be implemented provided that a correction to the address space and data rates is made. This type of address partition is not desirable or practical.

According to present architecture, it is important to describe the way data is sent to or received from the device and the time required to complete the operation in order to compare to the proposed invention.

In another aspect of the invention, termination could be used inside each silicon device for the data I/O and for the control lines. When multiple devices are used in a parallel connection, the capacitive load increases. When one considers high Data Rate transmission and good signal integrity, the number of devices attached decreases.

The termination arrangements employed are Data Rate depended in a multi-drop bus configuration. One such termination is described by the present inventor in other disclosures and patent application Since it takes time internal to the device to transfer information from a Block page to the page Register, it would be appropriate to start preparation of the next block while the data is Read out from the device. For a WRITE operation, while the data is written into a block page from the page register, the I/O Bus could be used to prepare the next write commands and data to a different page register. This will allow for seamless operation based on the interface Data Rate transfers described in this invention.

Referring to FIG. 5, a timing chart for a WRITE OP is shown. The object herein is not to analyze all of the timing parameters. It is important to show the amount of approximate time required for the device to complete the specified operation from beginning to end, and compare it to the time based on the invention as described herein.

For one of the prior art devices, the SAMSUNG K9K1G08R0B, operating at 1.8 volts as specified by the manufacturer, the timing parameters tWC=Write Cycle time and tRC=Read cycle time are each 60 nanoseconds.

As shown in the I/O line of FIG. 5, five tWC cycles are necessary to setup the command and Address information into the device. There is some detail specifications of when the signals are turned ON and OFF that are not considered for this explanation. There are 528 bytes of data that have to be transferred to the device, one byte every 60 nanoseconds. Then, the command is given to execute the programming of data into the device. After the command is given to execute the programming, the device takes about 500 microseconds to complete it. During this busy time, no further action is allowed on the interface until the device signifies that it is no longer busy. This is done with the removal of the signal called R/B.

Effectively, 5 cycles×60 nanoseconds=300 nanoseconds. Command and Address setup time, plus 528 bytes×60 nanoseconds per byte=31.7 microseconds, for data transfer to buffers.

Additional Considerations 500 microseconds to program the 528 bytes of data into the device is required.

Total time=532 microseconds approximately.

The most time is used by the device to transfer information from the page buffer to the block page.

It is obvious that the time to complete a write operation of 528 bytes is very long.

The 500 microseconds required to program the information into the device, if partitioned to time per byte, amounts to 500 microseconds/528 bytes, or approximately 947 nanoseconds per byte. If all bytes were written simultaneously in parallel, then the 528 byte flash block would be written in 947 nsec. This is a short time in comparison to the presently required program time of a complete page. One has to consider the practicality, logic overhead, power and possible reduction in bit density in a given silicon area to accommodate such solution.

If a compromise is reached in giving up something to gain something else, such as giving up some density in order to gain speed, then the 512 data byte block only needs to be redesigned.

Block Partition Description

Figure 8:
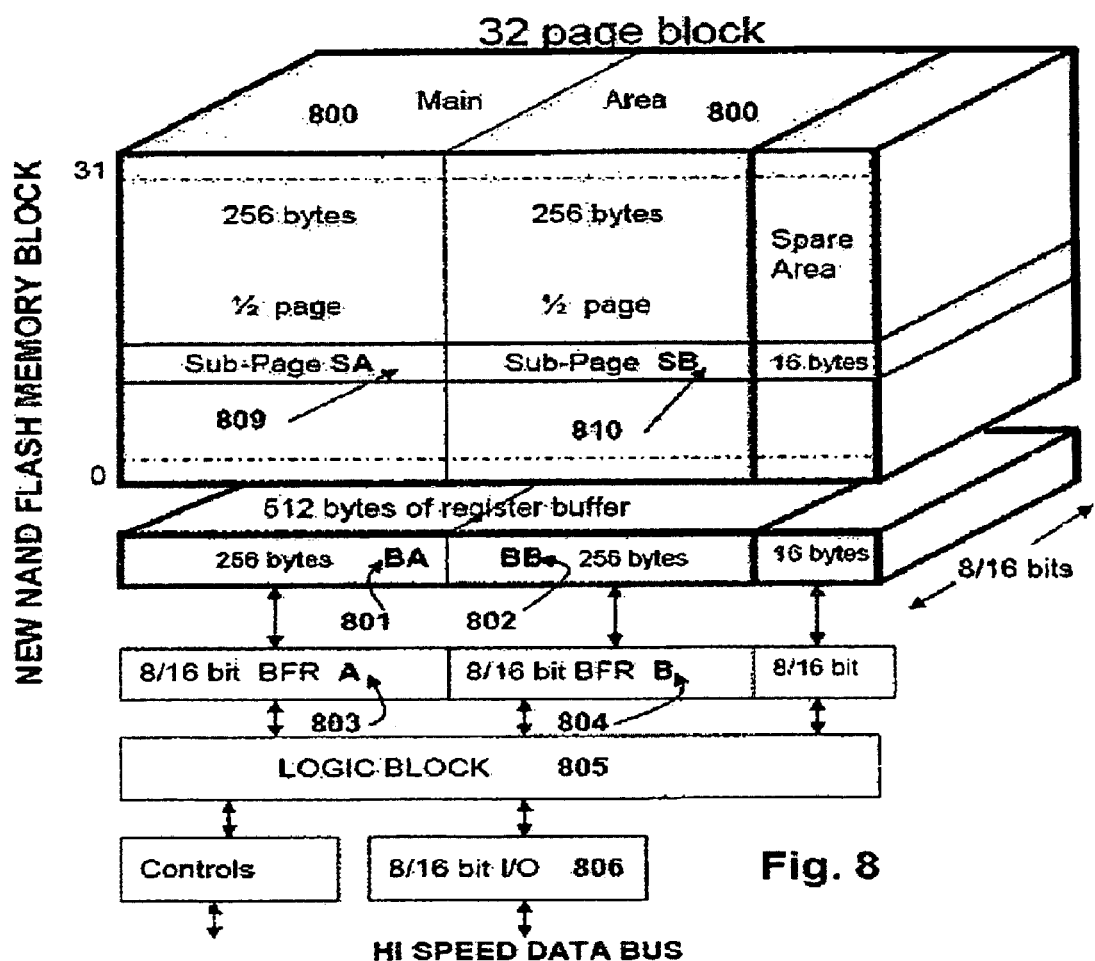
FIG. 8 depicts in block diagram form the proposed restructuring and partitioning of the internals of a FLASH device to n sections where n=2 as proposed in this invention.

Referring to FIG. 8, 9, 10, modified flash blocks are shown to better explain this invention. In this description we'll focus on the main core array block, block page, page buffer, global buffers, I/O interface and control logic modifications to make the data throughput faster by orders of magnitude than is presently specified for flash devices.

The main object of this invention is to describe methods by which a high bandwidth is accomplished within the limitations of the structure of the NAND Flash device.

Figure 1:
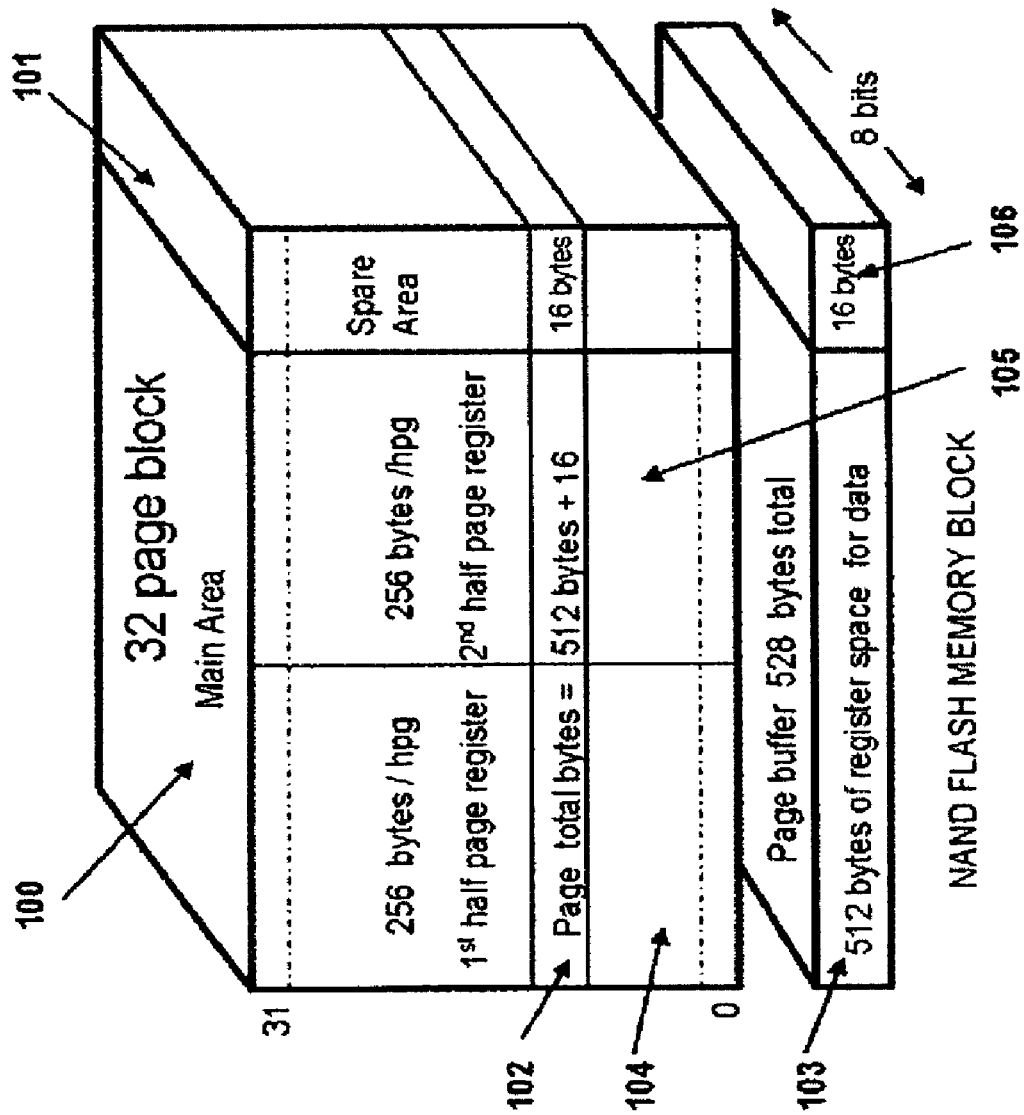
FIG. 1 depicts a 32 page core block of the prior art FLASH device for byte configuration.
Figure 2:
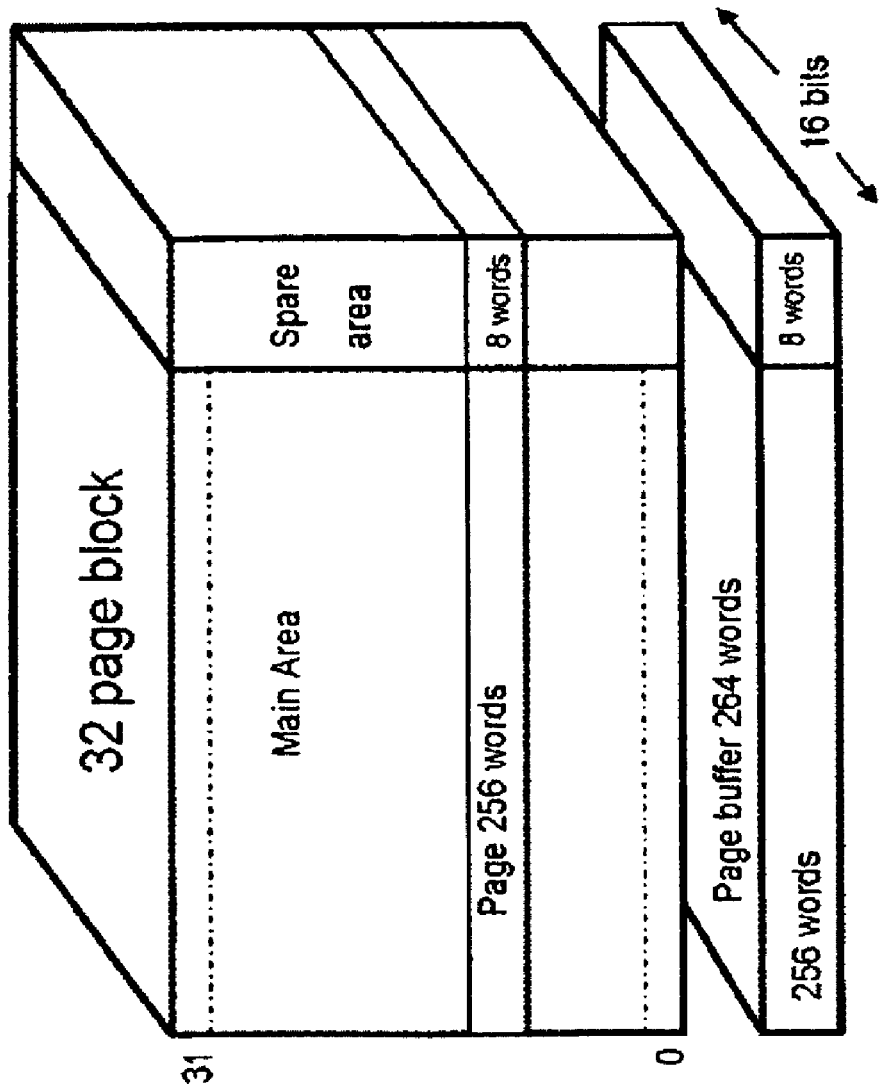
FIG. 2 depicts a 32 page core block of the prior art FLASH device for word configuration.

Referring to FIG. 1, the main area of the block of 32 pages is divided into two sections of 256 bytes per one half of each page. The page buffer of 512 bytes is under control of two Address or byte location counters. Each section is command controlled how is written to or read from. The data from the I/O has to be entered sequentially one byte at a time, for a single byte I/O interface, to fill the page buffer first and then the command is given to transfer the data sequentially from the page buffer into the main core memory. For a two byte (word) I/O interface, 256 data transfers are required to fill the page buffer. Referring to FIG. 8 and in contrast to FIG. 1, the main block is split into two sub-blocks 800. Each page of the sub-block is 256 bytes wide. The page buffer is split in two 256 sub-page buffers 801 named BA and 802 named BB. Each BA and BB sub-page buffer is controlled by the same address counter (not shown). The data in each 256 sub-buffer is entered sequentially and is fed by the 8/16 bit buffers A 803 and B 804 respectively.

The data is received through the 8/16 bit I/O 806, channeled by the logic 805 in the logic block and is temporarily stored in buffer A 803 and buffer B 804. If the data bytes are numbered 0, 1, 2, 3, 4 ... 511, byte 0 and every even numbered byte go through buffer 803. Byte 1 and every odd numbered byte go through buffer 804. For 16 bit I/O transfer, the data bytes 0,1 go through buffer 803 and bytes 2, 3 go through buffer 804 and the process alternates. The data to be written is sent by the controller under the control of the strobe signal WE. Presently, one byte of data is sent to the device for every cycle (tWC) of the WE strobe.

The described scheme requires that two bytes of data are sent to the device for every WE (tWC) cycle in an 8 bit I/O, or four bytes for a 16 bit I/O.

Figure 13:
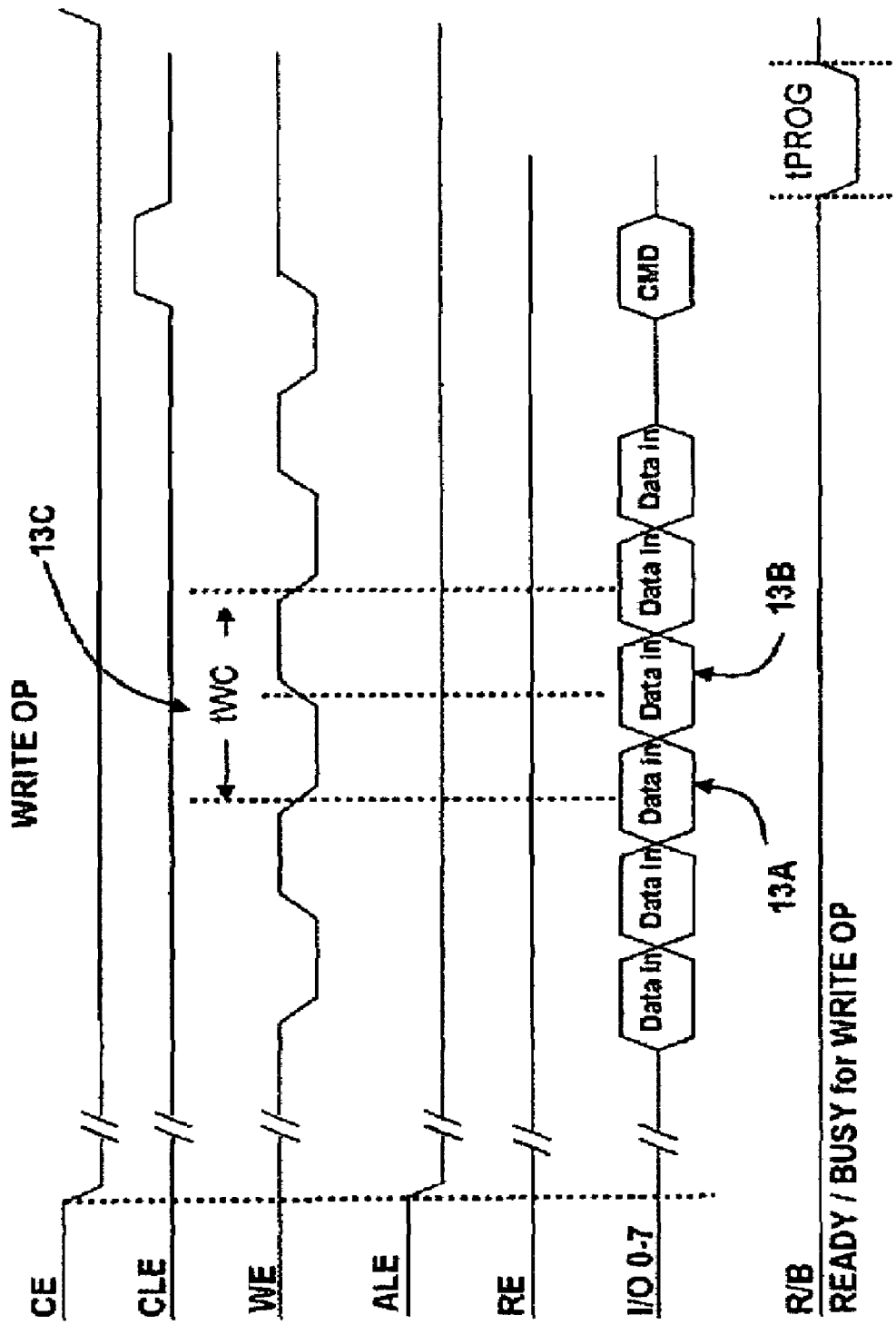
FIG. 13 depicts in diagram from the data byte sequence and relationship to the period of the WE signal as proposed in the invention for a WRITE operation function.

Referring to FIG. 13, data byte 13A and data byte 13B are sent to the device by the controller in tWC time 13C.

One could choose to have the WE signal with symmetrical duty cycle so that each byte occupies equal time in duration. The controller may choose to send the data to the device every rising edge of the WE signal. In this case, the WE (tWC) signal frequency would have to be twice the original WE frequency, or the (tWC) be one half the original. As the data is received, is steered to the appropriate 8/16 bit buffer A 803 and B 804 of FIG. 8. From buffers A and B, the data is steered to the sub-page buffers BA 801 and BB 802 respectively. At this point, data from BA and BB is transferred to the sub-pages SA 809 and SB 810 respectively under the control of the same 256 byte counter and the BL counter. In other words, two bytes of data are programmed at the same time. Assuming that the time for programming each byte into the core memory stays as in the original device specification, the time required to program a full page by simultaneously using two sub-pages is cut in half. Therefore, one would expect to write data into the device twice as fast in comparison to the original single page writing. The command and Address info is also sent to the device at twice the speed if the switching speed of the Address lines is fast enough.

Figure 9:
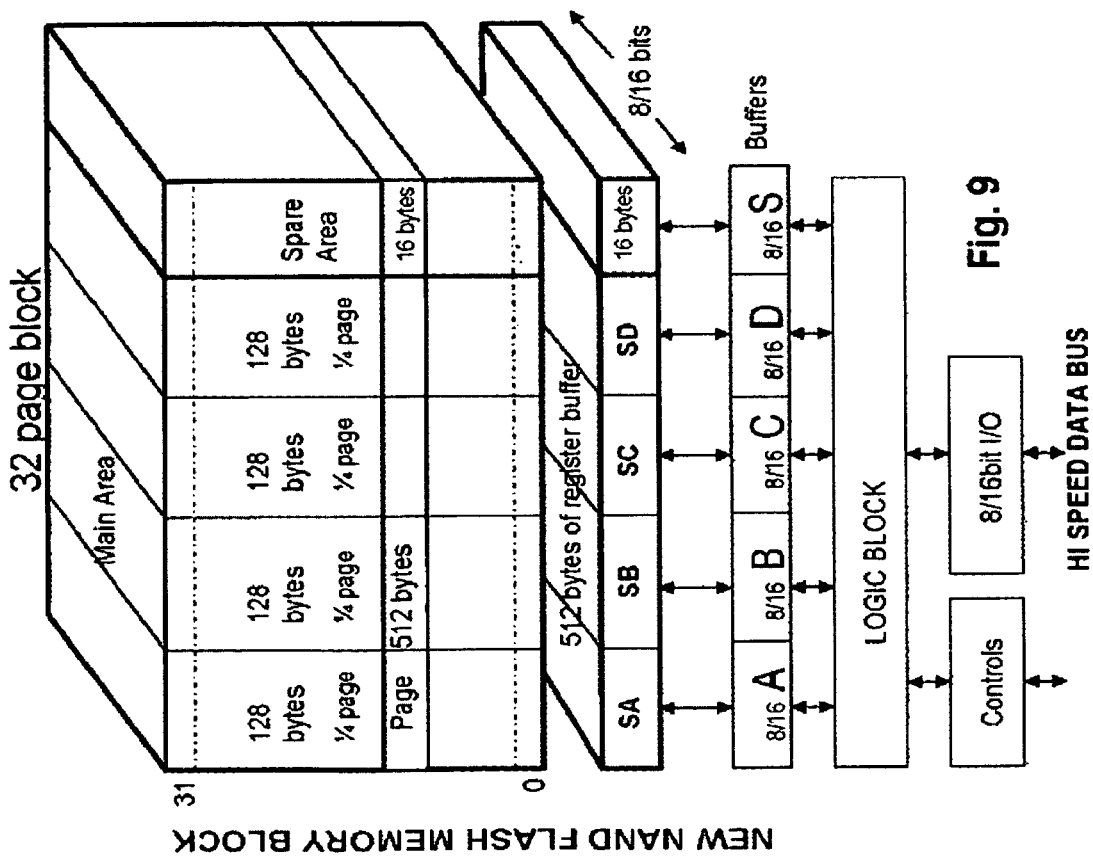
FIG. 9 depicts in block diagram form the proposed restructuring and partitioning of the internals of a FLASH device to n sections where n=4 as proposed in this invention.
Figure 10:
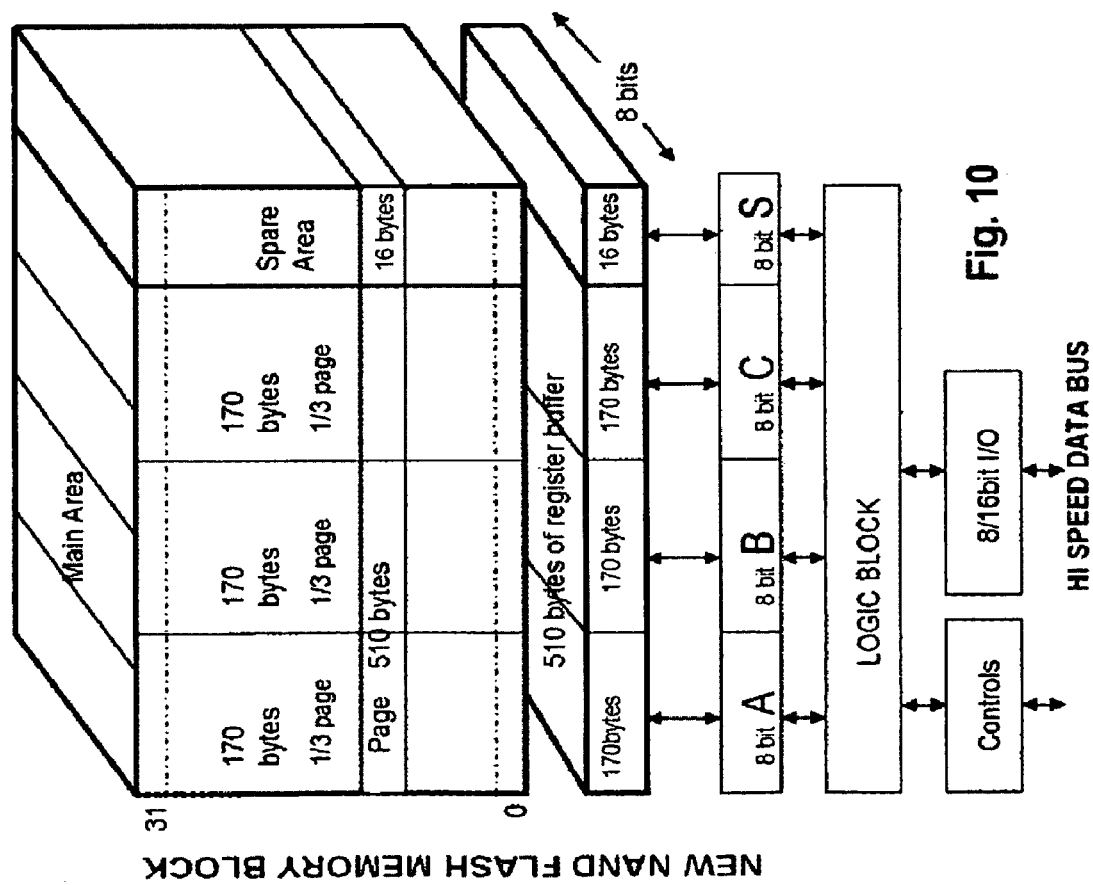
FIG. 10 depicts in block diagram form the proposed restructuring and partitioning of the internals of a FLASH device to n sections where n=3 as proposed in this invention.

Referring to FIG. 9, the block could be partitioned in 128 byte sub-blocks. In this case, the data on the I/O transmitted by the controller would have to be four times the rate of the original Data Rate. The control logic on the device would have to accommodate temporary buffers A, B, C, D one for each sub-page SA,SB,SC,SD. Data would be stored in the sub-buffers A, B, C, D starting at the same address point. If the received data is numbered 0, 1, 2, 3, 4 ... 511, byte 0, 1, 2, 3 would be stored in the first address of the sub-pages. The sequence does not have to be 0 to A, 1 to B, 2 to C and 3 to D. It could be any order mixed.

If we assume that the programming does not start until after the registers are full, the time required to program the Sub-Registers, SA, SB, SC, SD into the memory core would be one quarter the original programming time if all buffers, A, B, C, D start transferring simultaneously data into the block sub-pages.

Figure 11:
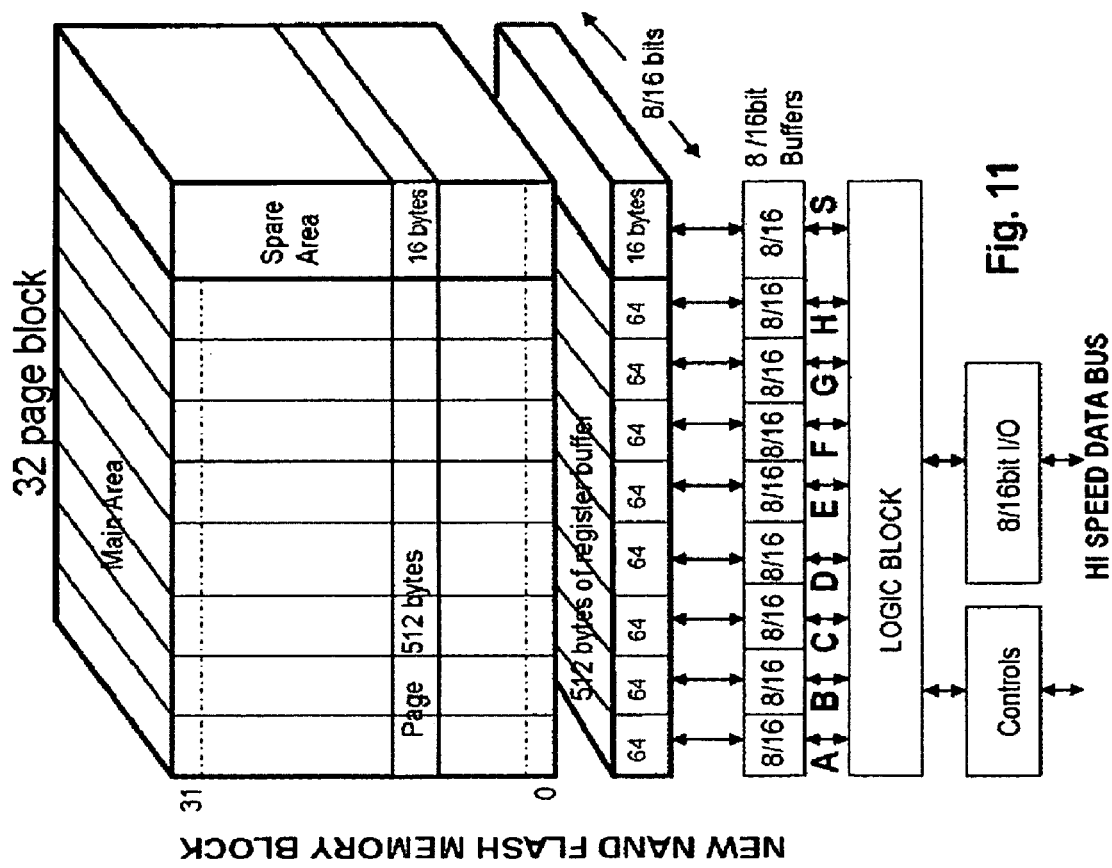
FIG. 11 depicts in block diagram form the proposed restructuring and partitioning of the internals of a FLASH device to n sections where n=8 as proposed in this invention.

Referring to FIG. 11, the time could be reduced further by dividing the block into 8 sub-blocks of 64 byte capacity. Increasing the number of sub-blocks eventually would have practical limitations for implementation and cost. All sub-registers are addressed with the same address. Data into the sub-registers and eventually into the sub-blocks is stored so that all sub-registers receive one byte before the address is stepped Presently, the data is first stored into the page buffer and then a command is given to the device to program the data into the page of the block. While the data is transferred to the page buffer from the interface, the device programming cannot start. This is a waste of time.

With this invention the following is proposed.

a) Transmit the data to the device I/O buffers as fast as the designed interface allows it.
b) Start programming the block page as soon as the first data into the page sub-registers settles.
c) As the data is pulled out of the page register, shift data and make it available for the next transfer to the block sub-page.
d) Continue the process until all data is programmed into the all sub-block pages.

It is obvious, because of the speed of the interface, that the page buffers will accumulate data faster than the programming of each data transfer to the sub-block page. Eventually, the data transfer to the I/O buffers and to the sub-page registers will end before the total programming to sub-pages is finished. The BUSY TIME of the device will extend beyond the total time of I/O transfer of data. It will not be as long as presently defined for the device.

As it was stated above, the time per byte programming was approximately 947 nanoseconds for the device specification of the example device. If we assume that for the same device the programming of a byte or bytes is the same 947 nanoseconds, we can reduce the total programming time. If we subdivide the page register to 8 sub-page registers and subdivide the block to 8 sub-blocks, the time required to program a block page will be reduced by a factor of 8 assuming that the programming starts after the sub-page registers are filled. In other words, the BUSY TIME shown in FIG. 13 will be reduced to (500 divided by 8) 62.5 microseconds approximately. Further reduction of programming time will be achieved by starting the programming process as soon as the sub-registers receive the fist byte. It could be designed that the data on the I/O bus is synchronized so that the programming is also synchronized without delays or gaps.

For the example Flash device, Samsung K9K1G08R0B, the data transfer time from the controller to the device required for 512 bytes of data on a single 8 bit interface with 60 nanosecond tWC is, 512 bytes×60 nanoseconds.=30.72 microseconds.

If we are going to reduce the 30.72 microseconds by the same factor of 8, then, the new tWC has to be (60 nanoseconds divided by 8) 7.5 nanoseconds. The speed of this interface translates to 133 MHz Data Rate and frequency if only a single data transfer occurs in a single tWC. If two data transfers occur in a single tWC, one for each half of the period, then the Data Rate of the interface is 266 MHz. This I/O interface speed is compatible with 266 MHz DDR SDRAM interface speed.

Ordering of Data

When the block is subdivided to sub-blocks, and the page register into sub-registers, the data will be written into them in a pre-specified order. Referring to FIG. 12, the array is the page register corresponding to a page of the block. The number of columns corresponds to the number of sub-registers in a page register and in sub-blocks in the block. Each row address corresponds to the location of the byte within the first sub-register and sub-block. Accessing the row will access the same location of all of the sub-registers and sub-blocks. Data bytes within the row do not have to be placed in a sequential order as shown. At implementation, for example, byte D0 could be placed in sub-register four or any other. How the sub-registers are programmed into sub-blocks is decided upon implementation chosen by the Flash designer and controlled by the Controller. During read time, the data would have to be retrieved in the same way it was written.

READ Op

From the specification of the Flash device of our example, SAMSUNG part number K9K1G08R0B, the read operation is shown in FIG. 5. Examining FIG. 5, one can see that the CMD and ADDRESS are written into the device under the control of the WE signal. Then, the device goes into a busy time of approximately 15 microseconds, shown as R/B signal, during which time data is transferred from the page of the block to the page register from the starting address until the ending address of the page. Then the busy time expires. The controller monitors the busy line and when it goes inactive it starts the RE clock to transfer data from the device to the controller. The RE line has a (tRC) read cycle time of 60 nanoseconds as specified for the device. There is only one transfer of a single byte of data with each falling edge of the RE signal. For a two byte data I/O there would be two bytes transferred.

Figure 14:
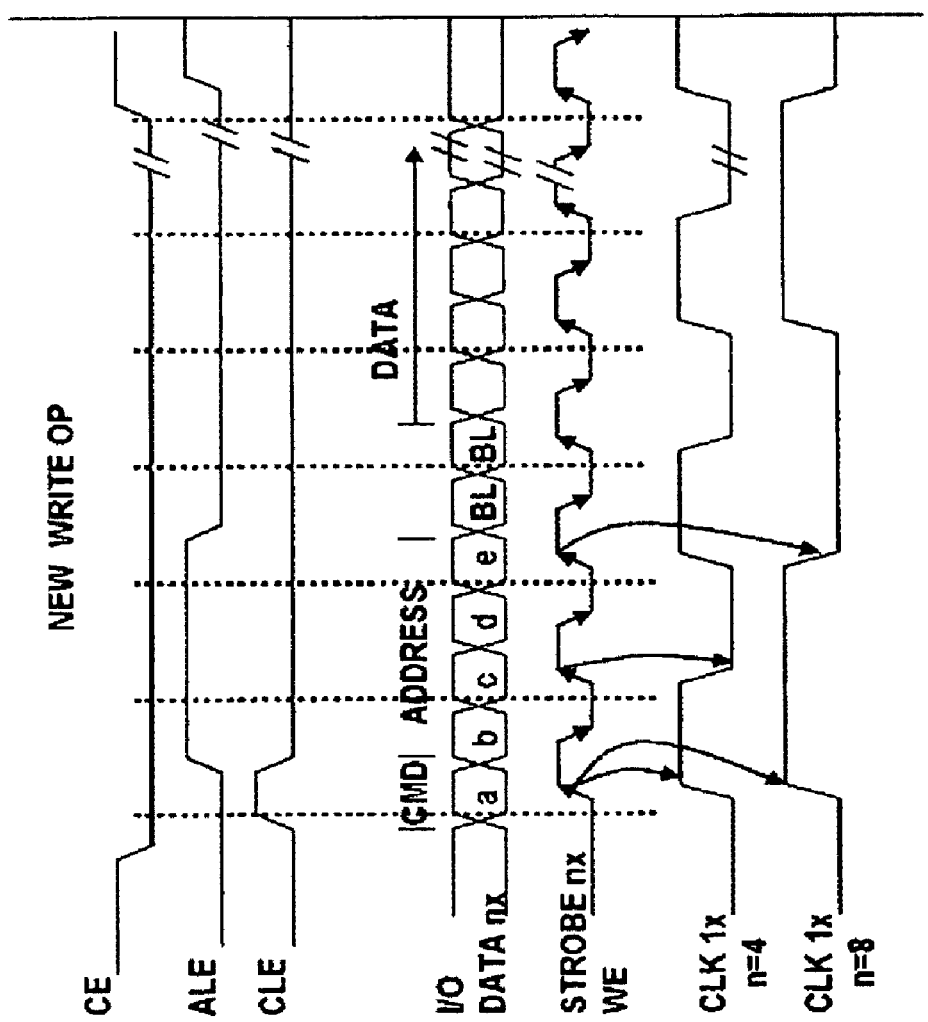
FIG. 14 depicts in diagram form the base clock frequency and strobe WE frequency in a multi-device cluster arrangement for a WRITE operation function of the proposed invention.

From the beginning of the Busy time until the full transfer of 528 bytes is completed, it will take, (15 microseconds busy time+31.7 microseconds of 528 bytes of transfer), a total of 46.7 microseconds. This I/O interface is not suitable for higher bandwidth of data transfers. The approach taken for the WRITE OP to partition the block into sub-blocks is similarly applied to the READ OP. Referring to FIG. 11, where the block is divided to 8 sub-blocks, data from each sub-block is read out at the same time and starting at the same address. The number of bytes to be transferred from sub-block page to sub-registers would be at the control of the BL value. The BL value is transmitted to the device during the CMD and ADDRESS transmission sequence as shown in FIG. 14.

Presently, there is no data read out until the register is filled up.

With this invention, data could start to output at the I/O pins as soon as the data arrives at the sub-registers. Transfer will commence as soon as the first sub-registers receive data that is equal to the width of the I/O bus.

For the device of the example, each byte of data transfer takes approximately 29 nanoseconds per transfer from the block page to the page register. Assuming that the busy time expires after all of the data has been moved from to the page register, the read out to the I/O pins occurs at 60 nanoseconds cycle (tRC) until there are no more RE pulses.

Figure 15:
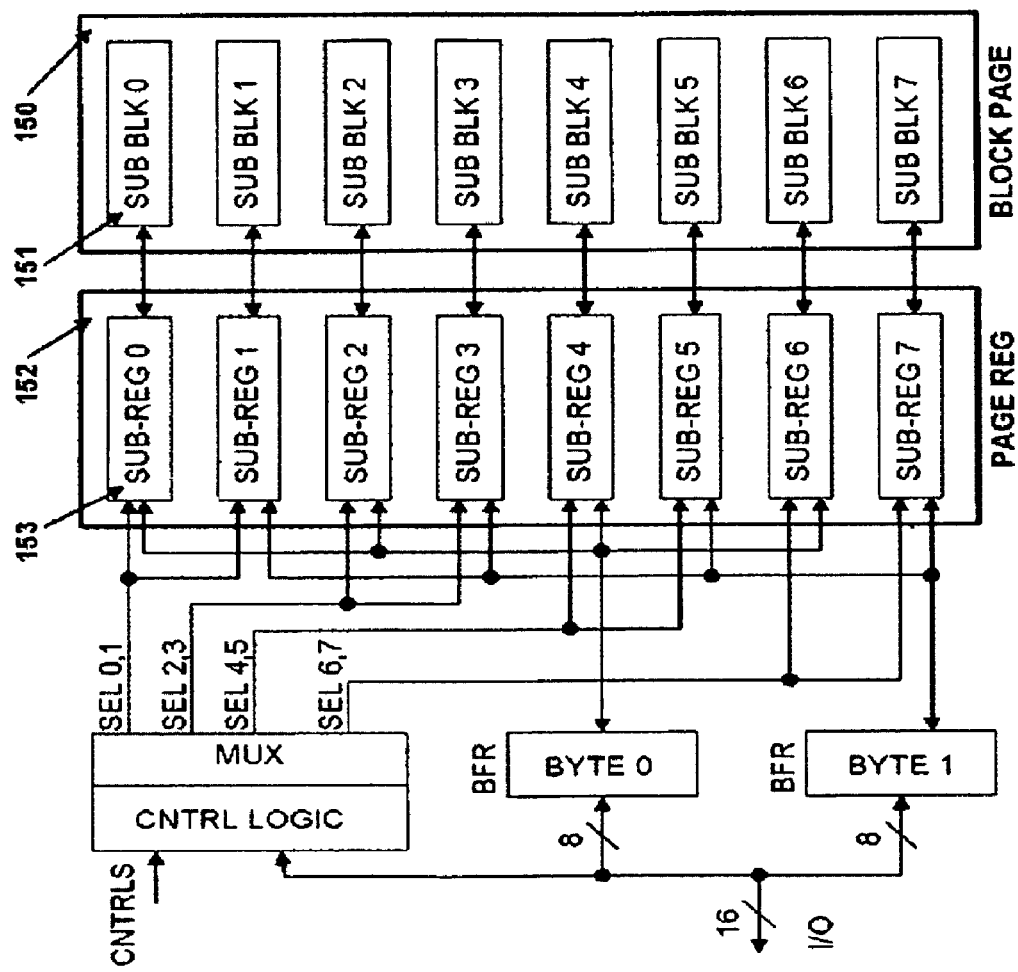
FIG. 15 depicts in block diagram form the Sub-pages of a Block Page and Sub-page registers multiplexed along with the I/O buffers in the proposed invention.

Referring to FIG. 15, the partition of the Block 150 to 8 sub-blocks (0-7) 151 each having 32 pages and the page register 152 to 8 sub-page registers (0-7) 153 along with the control logic and the I/O buffers is shown.

For a READ OP and under control of the starting address and internal device timings, data from the sub-block pages 151 is transferred into the page sub-registers 153. If the transfer time is 29 nanoseconds per transfer, then 8 bytes are placed into the page sub-registers. To transfer all 8 bytes from the page sub-registers 153 to the two byte I/O buffers, the transfer rate has to be one quarter of 29 nanoseconds, or 29/8=3.625 nanoseconds per I/O transfer. A multiplexed mechanism is employed to transfer two sub-registers into the 16 bit I/O buffers every 3.625 nanoseconds. Rounding the time to 3.75 nanoseconds corresponds to 133 MHz frequency or 266 MHz data rate, two transfers per (tRC) cycle. This rate is compatible with the DDR SDRAM rate of 266 MHz.

The above description does not exclude wider I/O buffer interface such as four bytes.

Burst Length Description

In the present architecture, there is no command to set any Burst Length BL of data that the device should expect to receive or read out. A BL command would be very useful for improved device performance.

This invention suggests that in the stream and before the data stream starts that BL information is inserted in one or two bytes.

Another method of presentation of Address, Data and Burst Length BL information to the Flash device could be under the control of continuous clock applied to the device, along with the strobe signal on I/O pins.

The strobe signal could be source synchronous, meaning that it could originate from the controller and from the device based on the operation.

For a WRITE operation, the controller would initiate the strobe and for a Read operation the device will initiate it. The strobe signal is normally used to synchronize the transfer of data to a device by providing proper timing control.

Referring to FIG. 14 and assuming that the I/O interface is only one byte wide, the structure of information in the case shown could be one byte Command information (a), the next four bytes (b, c, d, e) Address information as it exists in present FLASH devices. The next two bytes could be Burst Length BL information.

A total of 16 bits could be used for BL value. The BL value could be transmitted every time a Write or a Read Command is issued, or transmitted once and then saved in a register and reused. If it is going to be used from the register, the command could contain a modifier bit to tell the device to apply the BL information in the register. To reuse the BL value, a modifier bit in the BL bytes could, also, be used to indicate that.

In contrast, the DDR SDRAM memory devices have the BL established to be 4 or 8 bytes fixed.

The FLASH devices do not have to adhere to fixed Burst Lengths like the DDR SDRAM. The Flash devices do not have to deal with refresh and write back issues that may conflict with long Burst Lengths. The BL information is new introduction in the interface stream and is part of this invention. The amount of data is determined based on the value of the BL in the register. The Flash device will continue to receive data bytes until the BL is reduced to zero by counting down the starting value or counting up to reach the BL value.

For a WRITE operation, when the BL counter reaches the predetermined value, an automatic Program operation could start. This action will save additional time used presently for transmission of the Program Command. This is also part of this invention.

Presently, the controller supplies the strobe or WE signal to strobe the information from the I/O lines into the buffers. Unlike the present interface where the data is stored into the buffers with the rising edge of the WE signal, information on the I/O lines will have to be clocked into the buffers with the rising and falling edge of the STROBE or WE signal or with two separate WE or clock signals of proper phase. This method will transfer data into the device at much higher rate than presently. Since the Flash device does not have to do internal housekeeping in a synchronized manner, the continuous clock is not required to be applied to the device all the time.

It could be started at the beginning or the operation and be maintained only for the duration of the operation. This saves power.

The signal CLK 1×, n=4 means that for every period p of the device four Data bits are transferred under control of the WE edges.

For CLK 1×, n=8 means that for every period p of the device eight Data bits are transferred under control of the WE edges shown in FIG. 14

These signals could be supplied by the controller or could be generated internally by division of the STROBE or WE signal.

By generating this signal internally from the STROBE or WE signal, an I/O pin will be saved in both device and controller. If the CLK 1× signal is supplied by the controller to an I/O pin, it does not have to be applied continuously.

The length of time that the CLK 1× signal is present at the device pin is determined by design requirements for the device.

The other signals shown in FIG. 14, CLE, ALE and CE are signals used in prior art Flash devices.

It will be apparent that improvements and modifications may be made within the purview of the invention without departing from the scope of the invention defined in the appended claims.

I claim:

1. A method for communicating between an IO bus and flash memory banks DEVICE A and DEVICE B, wherein the IO bus comprises signals SYS WE (Write Enable) and SYS DATA (SYSTEM DATA), both signals being data bit streams having a period pl, the method comprising the steps of:
   1) generating a WE A (WRITE ENABLE to DEVICE A) signal WE having a period pl;
   2) generating a WE B (WRITE ENABLE to DEVICE B) signal having a period pl;
   3) generating a DATA A (DATA TO DEVICE A) signal whose valid start time is triggered by a rising edge of SYS WE, and whose value is that of the SYS DATA signal at the time of the rising edge of SYS WE, and maintained at that value for a period 2pl;
   4) writing the DATA A into DEVICE A, triggered by the WE A signal;
   5) generating a DATA B signal whose valid start time is triggered by the falling edge of SYS WE, and whose value is that of the SYS DATA signal at the time of the falling edge of SYS WE, and maintained at that value for a period 2pl;
   6) writing the DATA B into DEVICE B, triggered by the WE B signal; and
   7) repeating steps 3) through 6 for each successive rising edge of SYS WE, so that the bits of the data bit stream of SYS DATA are alternately written into DEVICE A and then into DEVICE B, each such writing done with a period of twice that of SYS DATA, and therefore at a frequency of one-half that of SYS DATA.

2. A method for communicating between an IO bus and flash memory banks DEVICE A and DEVICE B, wherein the IO bus comprises signals SYS RE (Read Enable) and SYS DATA (SYSTEM DATA), both signals being data bit streams having a period pl, the method comprising the steps of:
   1) generating a RE A (READ ENABLE to DEVICE A) signal having a period pl;
   2) generating a RE B (READ ENABLE to DEVICE B) signal having a period pl;
   3) reading a DATA A signal, having a period of 2pl, from DEVICE A and writing it onto the SYS DATA signal, said reading triggered by the RE A signal, and said reading continuing for a period pl,
   4) reading the DATA B signal, having a period of 2pl, from DEVICE B and writing it onto the SYS DATA signal, said reading triggered by the RE B signal, and said reading continuing for a period pl; and
   5) repeating steps 3) and 4) for each successive rising edge of SYS WE,
      so that the bits of the data bits of DEVICE A and DEVICE B are alternately read onto SYS DATA, each such writing done with a period one half of that of the DEVICE A or the DEVICE B signals, and therefore at a frequency of twice that of the DEVICE A or DEVICE B signals.

3. A method for communicating between an IO bus and flash memory banks DEVICE A and DEVICE B, wherein the IO bus comprises signals SYS WE (Write Enable), SYS RE (Read Enable), and SYS DATA (SYSTEM DATA), all three signals being data bit streams having a period pl, the method comprising the steps of:
   1) generating a WE A (WRITE ENABLE to DEVICE A) signal WE having a period pl;
   2) generating a WE B (WRITE ENABLE to DEVICE B) signal having a period pl;
   3) generating a DATA A (DATA TO DEVICE A) signal whose valid start time is triggered by a rising edge of SYS WE, and whose value is that of the SYS DATA signal at the time of the rising edge of SYS WE, and maintained at that value for a period 2pl;
   4) writing the DATA A into DEVICE A, triggered by the WE A signal;
   5) generating a DATA B signal whose valid start time is triggered by the falling edge of SYS WE, and whose value is that of the SYS DATA signal at the time of the falling edge of SYS WE, and maintained at that value for a period 2pl;
   6) writing the DATA B into DEVICE B, triggered by the WE B signal;
   7) repeating steps 3) through 6) for each successive rising edge of SYS WE;
   8) generating a RE A (READ ENABLE to DEVICE A) signal having a period pl;
   9) generating a RE B (READ ENABLE to DEVICE B) signal having a period pl;
   10) reading a DATA A signal, having a period of 2pl, from DEVICE A and writing it onto the SYS DATA signal, said reading triggered by the RE A signal, and said reading continuing for a period pl,
   11) reading the DATA B signal, having a period of 2pl, from DEVICE B and writing it onto the SYS DATA signal, said reading triggered by the RE B signal, and said reading continuing for a period pl; and
   12) repeating steps 10) and 11) for each successive rising edge of SYS WE,
   so that the bits of the data bit stream of SYS DATA are alternately written into DEVICE A and then into DEVICE B, each such writing done with a period of twice that of SYS DATA, and therefore at a frequency of one-half that of SYS DATA, and
   so that the bits of the data bits of DEVICE A and DEVICE B are alternately read onto SYS DATA, each such writing done with a period one half of that of the DEVICE A or the DEVICE B signals, and therefore at a frequency of twice that of the DEVICE A or DEVICE B signals.

4. The method of claim 3, further comprising triggering the RE A, RE B, WE A, and WE B from the SYS WE signal.

* * * * *